(12) United States Patent
Choi

(10) Patent No.: US 11,700,725 B2
(45) Date of Patent: Jul. 11, 2023

(54) MEMORY DEVICE AND METHOD FOR FABRICATING THE SAME

(71) Applicant: SK hynix Inc., Gyeonggi-do (KR)

(72) Inventor: Kangsik Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/718,849

(22) Filed: Apr. 12, 2022

(65) Prior Publication Data

US 2022/0238527 A1    Jul. 28, 2022

Related U.S. Application Data

(63) Continuation of application No. 16/899,122, filed on Jun. 11, 2020, now Pat. No. 11,329,046.

(30) Foreign Application Priority Data

Dec. 30, 2019  (KR) .......................... 10-2019-0178427

(51) Int. Cl.
*H10B 12/00* (2023.01)
*G11C 11/408* (2006.01)
*G11C 11/4097* (2006.01)

(52) U.S. Cl.
CPC ........ *H10B 12/312* (2023.02); *G11C 11/4085* (2013.01); *G11C 11/4097* (2013.01); *H10B 12/50* (2023.02)

(58) Field of Classification Search
CPC .... H10B 12/312; H10B 12/50; H10B 12/482; H10B 12/03; H10B 12/05; H10B 12/30; H10B 12/02; H10B 12/01; G11C 11/4085; G11C 11/4097; H01L 28/90; H01L 27/0688
See application file for complete search history.

(56) References Cited

U.S. PATENT DOCUMENTS

2021/0202488 A1* 7/2021 Choi ..................... H10B 12/03

* cited by examiner

Primary Examiner — Edward Chin
(74) Attorney, Agent, or Firm — IP & T Group LLP

(57) ABSTRACT

A memory device includes a substrate, an active layer that is spaced apart from the substrate and laterally oriented, a word line that is laterally oriented in parallel to the active layer along one side of the active layer, an active body that is vertically oriented by penetrating through the active layer, a bit line that is vertically oriented by penetrating through the active layer to be spaced apart from one side of the active body, and a capacitor that is vertically oriented by penetrating through the active layer to be spaced apart from another side of the active body.

15 Claims, 42 Drawing Sheets

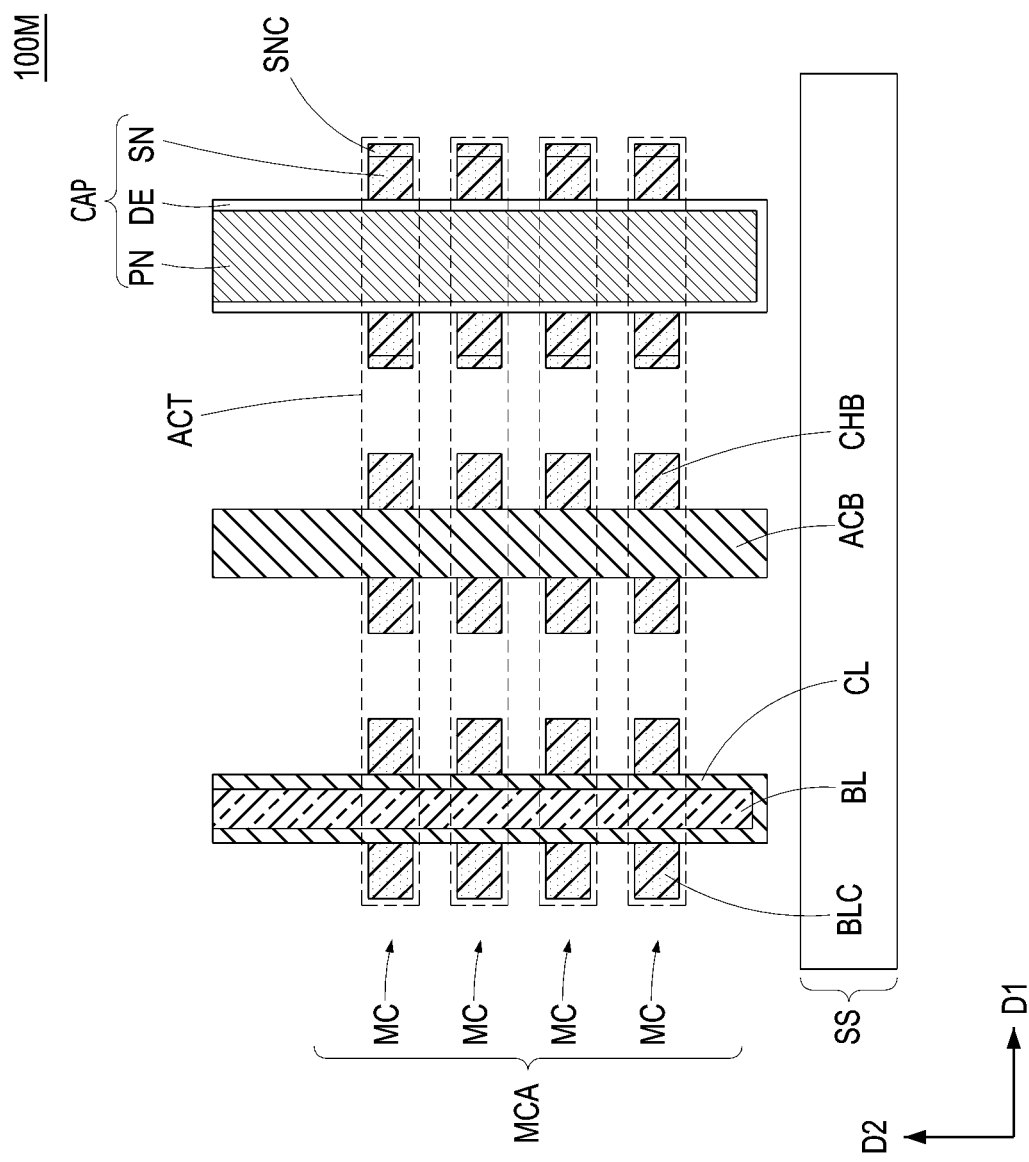

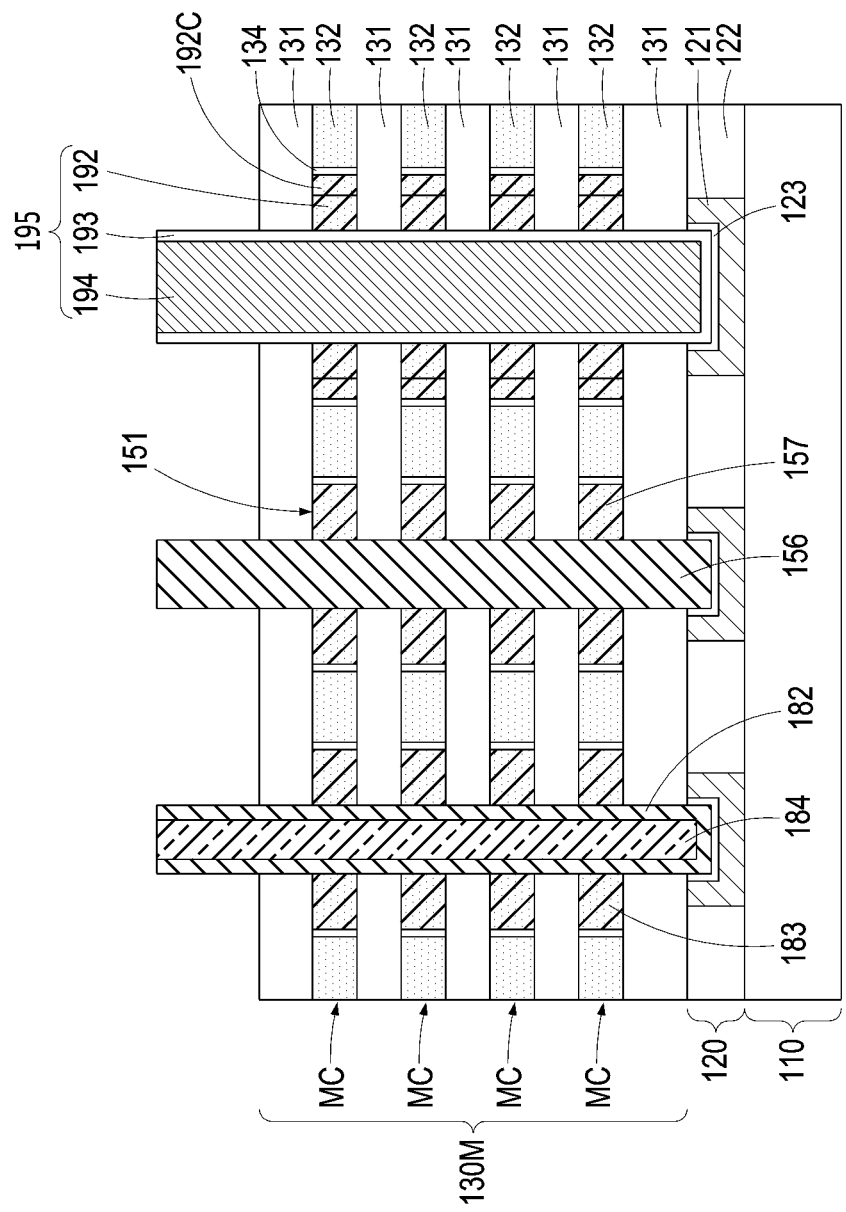

MEMORY DEVICE AND METHOD FOR FABRICATING THE SAME

CROSS-REFERENCE TO RELATED APPLICATIONS

This application is a continuation of U.S. patent application Ser. No. 16/899,122 filed on Jun. 11, 2020, which claims benefits of priority of Korean Patent Application No. 10-2019-0178427 filed on Dec. 30, 2019. The disclosure of each of the foregoing application is incorporated herein by reference in its entirety.

BACKGROUND

1. Field

Various embodiments of the present invention relate to a semiconductor device, and more particularly, to a semiconductor device and a method for fabricating the same.

2. Description of the Related Art

Recently, the size of the memory cell continues to be reduced in order to increase the net die of a memory device. As the size of memory cells becomes miniaturized, parasitic capacitance Cb decreases and capacitance increases. However, it is difficult to increase the net die due to the structural limitations of memory cells.

SUMMARY

Embodiments of the present invention are directed to highly integrated memory cells, a memory device including the integrated memory cells, and a method for fabricating the memory device.

In accordance with an embodiment of the present invention, a memory device includes a substrate; an active layer that is spaced apart from the substrate and laterally oriented, a word line that is laterally oriented in parallel to the active layer along one side of the active layer, an active body that is vertically oriented by penetrating through the active layer, a bit line that is vertically oriented by penetrating through the active layer to be spaced apart from one side of the active body, and a capacitor that is vertically oriented by penetrating through the active layer to be spaced apart from another side of the active body.

In accordance with another embodiment of the present invention, a memory device includes memory cells arranged vertically, wherein each of the memory cells includes an active layer including a first source/drain region, a second source/drain region, and a channel body laterally oriented between the first source/drain region and the second source/drain region, a word line laterally oriented in parallel to one side of the active layer, an active body penetrating through the channel body, a bit line vertically oriented by penetrating through the active layer to be coupled to the first source/drain region, and a capacitor vertically oriented by penetrating through the active layer to be coupled to the second source/drain region.

In accordance with yet another embodiment of the present invention, a method for fabricating a memory device includes forming a plurality of active layers arranged vertically with respect to a substrate, forming a vertically oriented active body that penetrates through the active layers to interconnect the active layers to each other, forming a vertically oriented bit line that is spaced apart from one side of the active body and penetrates through the active layers, forming a vertically oriented capacitor that is spaced apart from another side of the active body and penetrates through the active layers, and forming a plurality of word lines that are laterally oriented adjacent to one side of each of the active layers.

These and other features and advantages of the present invention will become apparent to those with ordinary skill in the art of the invention from the following detailed description and drawings.

BRIEF DESCRIPTION OF THE DRAWINGS

FIG. 1C is a cross-sectional view of the memory device taken along a line B-B' of FIG. 1B.

FIGS. 2A and 2B are cross-sectional views illustrating a memory device in accordance with another embodiment of the present invention.

DETAILED DESCRIPTION

Figure 1A:
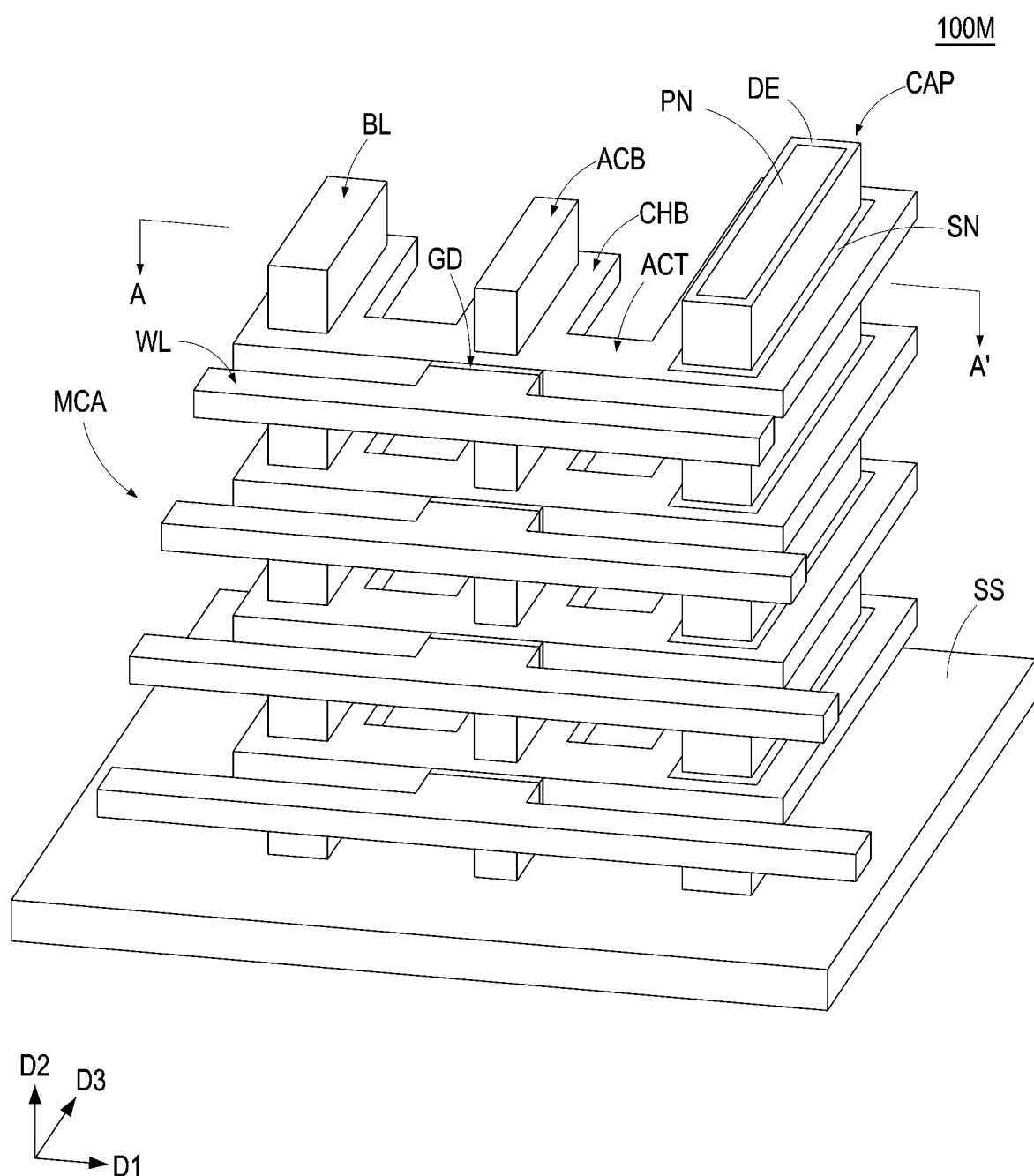
FIG. 1A is a perspective view schematically illustrating a structure of a memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In accordance with an embodiment of the present invention, a memory device may include at least one laterally extending active layer (may also be referred to as a lateral active layer), at least one single word line WL, a vertical bit line BL passing through the at least one active layer, and a vertical capacitor also passing through the at least one active layer. The at least one single word line WL may be at the same level from a substrate as the at least one lateral active layer.

Figure 1B:
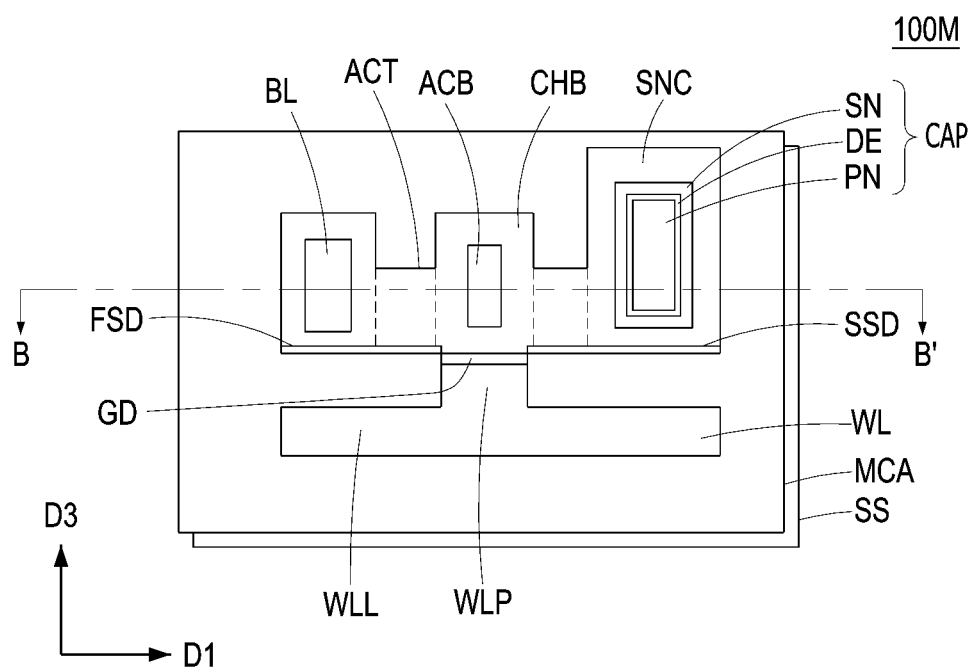
FIG. 1B is a plan view of the memory device taken along a line A-A' of FIG. 1A.

FIG. 1A is a perspective view schematically illustrating a structure of a memory device 100M in accordance with an embodiment of the present invention. FIG. 1B is a plan view of the memory device 100M taken along a line A-A' of FIG. 1A, and FIG. 1C is a cross-sectional view of the memory device 100M taken along a line B-B' of FIG. 1B.

Referring to FIGS. 1A to 1C, the memory device 100M may include a substrate SS, an active layer ACT laterally oriented and spaced apart from the substrate SS, a word line WL laterally oriented, parallel to the active layer ACT along one side of the active layer ACT, an active body ACB vertically oriented and passing through the active layer ACT, a bit line BL vertically oriented and passing through the active layer ACT to be spaced apart from one side of the active body ACB, and a capacitor CAP vertically oriented and passing through the active layer ACT to be spaced apart from the other side of the active body ACB.

The substrate SS may provide a plane extending in a first direction D1 and a third direction D3. A memory cell array MCA may be positioned vertically over the substrate SS in a second direction D2. The second direction D2 may be perpendicular to the first direction D1 and the third direction D3. The second direction D2 may simply be referred to as a vertical direction or orientation. The memory cell array MCA may include a plurality of memory cells MC arranged vertically in the second direction D2. The memory cell array MCA may be positioned over the substrate SS. The memory cells MC may be positioned over the substrate SS. For example, the memory cell array MCA may be or include a Dynamic Random-Access Memory (DRAM) memory cell array.

Each of the memory cells MC may include an active layer ACT, a word line WL, a bit line BL, and a capacitor CAP. A plurality of active layers ACT may be vertically arranged in the second direction D2. The active layers ACT may overlap vertically in the second direction D2. Each of the active layers ACT may have a shape of a plate whose cross section has a plurality of fingers. In other words, each of the active layers ACT may have a first elongated part extending laterally in the first direction D1 and a plurality of fingers extending from the elongated part in the third direction D3. The fingers may be spaced apart from each other at a regular interval. The fingers may be of the same shape and size, however, the invention is not limited to this. A first finger of each active layer ACT may be a portion of the active layer ACT through which the active body ACB penetrates. A second finger of each active layer ACT may be a portion of the active layer ACT through which the bit line BL penetrates, and a third finger of each active layer ACT may be a portion of the active layer ACT through which the capacitor CAP penetrates. The active body ACB, the bit line BL, and the capacitor CAP may pass centrally through the respective first, second, and third fingers leaving equal portions of each finger on either of their respective sides in the first direction D1 and the third direction D3.

Each of the active layers ACT may include a first source/drain region FSD, a second source/drain region SSD, and a channel body CHB arranged in the first direction D1 between the first source/drain region FSD and the second source/drain region SSD. The first source/drain region FSD, the second source/drain region SSD, and the channel body CHB may be positioned at the same level.

A laterally oriented word line WL may be positioned in parallel to one side of each of the active layers ACT. The active body ACB may penetrate through the plurality of active layers ACT which are arranged in the second direction D2. The active body ACB may be vertically oriented in the second direction D2. The active body ACB may be referred to as an 'active pillar'. The active body ACB may have a rectangular cross-section when viewed from the top. The active body ACB may pass through the channel body CHB of each active layer as it extends in the second direction D2. The channel body CHB of each active layer ACT may surround the active body ACB passing through it. Hence, each channel body CHB may be positioned at the same level as the corresponding active layer ACT. A plurality of channel bodies CHB may overlap vertically in the second direction D2. The word lines WL may vertically overlap in the second direction D2. Ends of the word lines WL may form a stepped structure. For example, as shown in the embodiment of FIG. 1A, the word lines may form a stepped structure with their length in the third direction decreasing stepwise from a bottom word line next to the substrate SS toward a top word line along the second direction.

The bit line BL may be vertically oriented in the second direction D2 and may penetrate through each active layer ACT. The bit line BL may be coupled to the first source/drain regions FSD. The bit line BL may also have a rectangular cross-section when viewed from the top. The capacitor CAP may include a storage node SN, a dielectric layer DE, and a plate node PN. The storage nodes SN may be formed in each of the active layers ACT to be coupled to the respective second source/drain regions SSD. The dielectric layer DE and the plate node PN may extend in the second direction D2 and penetrate through the active layers ACT.

The memory device 100M may further include a plurality of bit line contact nodes BLC (shown in FIG. 1C) formed in each of the active layers ACT. Each contact node BLC is coupled to the first source/drain region FSD of a respective active layer ACT and the bit line BL. The memory device 100M may further include a contact liner layer CL that is vertically oriented (i.e., extending in the second direction D2) to penetrate through the bit line contact nodes BLC in the second direction D2 while surrounding the sidewall of the bit line BL. The bit line contact node BLC may also surround the bottom of the bit line BL. The bit line contact node BLC may not surround the top of the bit line BL.

The bit line BL, the active body ACB, and the capacitor CAP may extend vertically upwardly from the substrate SS. Each of the plurality of active layers ACT may be positioned at the same level with one word line WL. The active layers ACT may be parallel to the plane of the substrate SS.

As shown in FIG. 1B, a gate dielectric layer GD may be formed between one side of the channel body CHB and the word line WL. Each of the word lines WL which has a generally elongated shape extending in the first direction D1 may also include a protrusion WLP extending laterally in the third direction D3 to directly contact the gate dielectric layer GD. The portion of each word line WL extending in the first direction D1 may be referred to herein as a line portion WLL of the word line WL. The line portion WLL of each word line WL may be spaced apart from the first and second source/drain regions FSD and SSD of a corresponding active layer ACT.

The plate node PN and the dielectric layer DE may each be oriented perpendicular to the substrate SS in the second direction D2, and the dielectric layer DE may surround the sidewall of the plate node PN. The dielectric layer DE may also surround the bottom of the plate node PN. A plurality of storage nodes SN may be arranged vertically to the substrate SS in the second direction D2. The storage nodes SN may be formed in respective active layers ACT and shaped to surround the dielectric layer DE and the plate node PN. The storage nodes SN and the word lines WL may be positioned at the same level in the second direction D3. The storage nodes SN may contact the capacitor contact nodes SNC. The capacitor contact nodes SNC may contact the second source/drain areas SSD. The capacitor contact nodes SNC may surround the storage nodes SN. The storage nodes SN and the capacitor contact nodes SNC may be positioned at the same level. The storage nodes SN may have a rectangular ring shape from a plane view (see FIG. 1B).

Figure 2A:
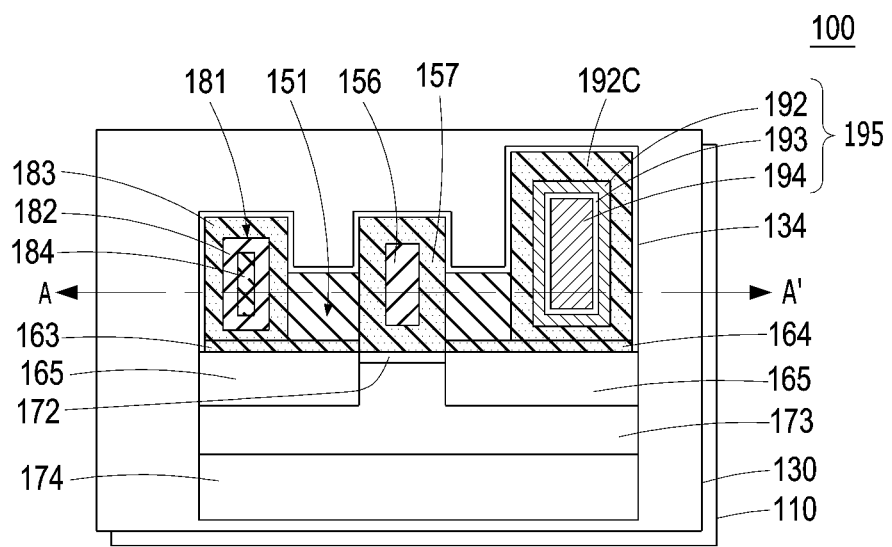

FIGS. 2A and 2B are cross-sectional views illustrating a memory device 100 in accordance with another embodiment of the present invention.

Referring to FIGS. 2A and 2B, the memory device 100 may include a peripheral circuit 110, a lower structure 120 and a memory cell array 130M that are sequentially formed over the peripheral circuit 110.

The peripheral circuit 110 may include a plurality of control circuits. At least one control circuit of the peripheral circuit 110 may include an N-channel transistor, a P-channel transistor, a CMOS circuit, or a combination thereof. At least one control circuit of the peripheral circuit 110 may include an address decoder circuit, a read circuit, a write circuit, and the like. At least one control circuit of the peripheral circuit 110 may include a planar channel transistor, a recess channel transistor, a buried gate transistor, a fin channel transistor (FinFET) and the like.

The memory cell array 130M may include a DRAM memory cell array, and the peripheral circuit 110 may include a sense amplifier SA. The sense amplifier SA may be coupled to a multi-level metal wire MLM.

The lower structure 120 may include an etch stop layer 121 and a lower inter-layer dielectric layer ILD 122. The etch stop layer 121 may include a material having an etch selectivity in a series of etching processes for forming the subsequent memory cell array 130M. For example, the etch stop layer 121 may include a polysilicon layer. The etch stop layer 121 may be formed by depositing a polysilicon layer and etching the polysilicon layer. The etch stop layer 121 may be formed to have a shape of a plurality of etch stop layer islands over the lower structure 120 which are spaced apart from each other. A protective layer 123 may be formed on the surface of the etch stop layer 121.

The lower structure 120 may provide a plane extending in the first direction D1 and the third direction D3, and the memory cell array 130M may be positioned vertically in the second direction D2 over the lower structure 120. The second direction D2 may be perpendicular to the first direction D1 and the third direction D3.

The memory cell array 130M may include a plurality of memory cells MC that are arranged vertically in the second direction D2. First dielectric materials 131 may be formed to be vertically arranged in the second direction D2 between the memory cells MC. The first dielectric materials 131 and the memory cells MC may be alternately formed vertically in the second direction D2. Second dielectric materials 132 surrounding the memory cells MC may be formed between the first dielectric materials 131 that are positioned vertically. In an embodiment, the first dielectric materials 131 may, for example, include silicon oxide, and the second dielectric materials 132 may, for example, include silicon nitride.

Each of the memory cells MC may include an active layer 151, a word line 173, a bit line 184, and a capacitor 195. The active layers 151 may be vertically arranged in the second direction D2. Each of the active layers 151 may include a first source/drain region 163, a second source/drain region 164, and a channel body 157 oriented laterally in the direction D1 between the first source/drain region 163 and the second source/drain region 164. The first source/drain area 163, the second source/drain area 164, and the channel body 157 may be positioned at the same level. A word line 173 may be positioned to be laterally oriented in parallel to one side of each of the active layers 151. The active body 156 may be formed to penetrate through the active layers 151. The active body 156 may penetrate through the channel body 157 in the second direction D2. The bit line 184 may be vertically oriented in the second direction D2 and may penetrate through the active layers 151 to be coupled to the first source/drain region 163. The capacitor 195 may include a storage node 192, a dielectric layer 193, and a plate node 194. The storage node 192 may be formed in the active layers 151 to be coupled to the second source/drain region 164. The dielectric layer 193 and plate node 194 may penetrate through the active layers 151.

The memory device 100M may further include a bit line contact node 183 that is formed in the active layer 151 and coupled to the first source/drain region 163 and the bit line 184. The memory device 100 may further include a contact liner layer 182 that is vertically oriented to penetrate through the bit line contact node 183 in the second direction D2 while surrounding the sidewall of the bit line 184.

The sides of the active layer 151 may be covered by the protective layer 134. A portion of the protective layer 134 may be cut, and one side of the active layer 151 may be partially exposed by the cut protective layer 134. Herein, the exposed side may be the portions of the first source/drain region 163, the second source/drain region 164, and the channel body 157.

A gate dielectric layer 172 may be formed between one side of the channel body 157 and the word line 173. An isolation dielectric layer 165 may be formed between the first and second source/drain regions 163 and 164 and the word line 173. The word line 173 may contact a slit dielectric layer 174. As will be described later, a plurality of word lines 173 may be isolated from each other by the slit dielectric layer 174.

The plate node 194 and the dielectric layer 193 may be vertically oriented in the second direction D2 with respect to the lower structure 120, and the dielectric layer 193 may surround the sidewall of the plate node 194. A plurality of storage nodes 192 may be arranged vertically with respect to the lower structure 120 in the second direction D2. The storage nodes 192 may be formed in the active layer 151. The storage nodes 192 may be shaped to surround the dielectric layer 193 and the plate node 194. The storage nodes 192 and the word lines 173 may be positioned at the same level in the third direction D3. The storage nodes 192 may be in contact with the capacitor contact nodes 192C. The capacitor contact nodes 192C may contact the second source/drain region 164. The capacitor contact nodes 192C may surround the storage nodes 192. The storage nodes 192 and the capacitor contact nodes 192C may be positioned at the same level. The storage nodes 192 may have a lateral annular shape.

The bit line contact node 183 may be coupled to the first source/drain area 163, and the storage node 192 may be coupled to the second source/drain area 164. The bit line contact nodes 183, the storage nodes 192, and the channel body 157 may be laterally arranged in the first direction D1.

Each of the active layers 151 may be laterally oriented in the first direction D1. The word lines 173 may be laterally oriented in the first direction D1. The active layers 151 may be stacked vertically in the second direction D2. The word lines 173 may be stacked vertically in the second direction D2. The active layers 151 and the word lines 173 may be parallel to each other. The active layers 151 and the word lines 173 may be positioned at the same lateral levels. Ends of the word lines 173 may have a step shape in the second direction D2. In other words, the word lines 173 stacked in the second direction D2 may have different lengths. The bit line 184 and the capacitor 195 may be vertically oriented in the second direction D2. The bit line contact node 183 may extend from the first source/drain area 163 in the third direction D3. The storage node 192 may extend from the second source/drain area 164 in the third direction D3.

FIGS. 3A to 26B are cross-sectional views illustrating a method for fabricating a memory device in accordance with an embodiment of the present invention. FIGS. 3A to 26A are plan views, and FIGS. 3B to 26B are cross-sectional views.

Figure 3A:
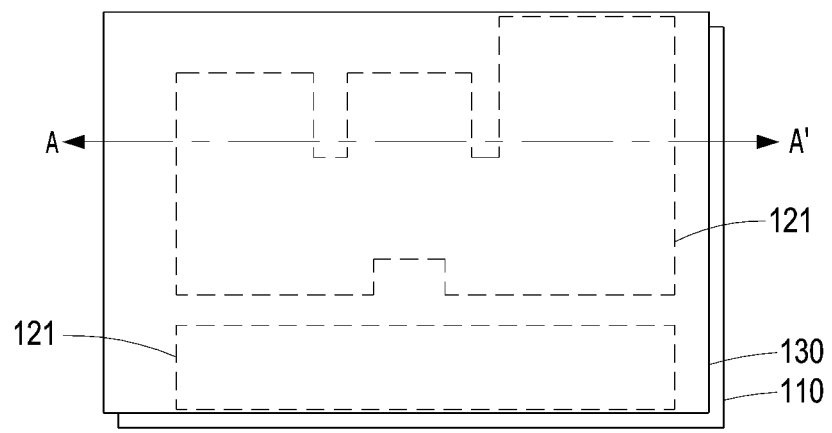
FIGS. 3A to 26B are cross-sectional views illustrating a method for fabricating a memory device in accordance with an embodiment of the present invention.
Figure 3B:
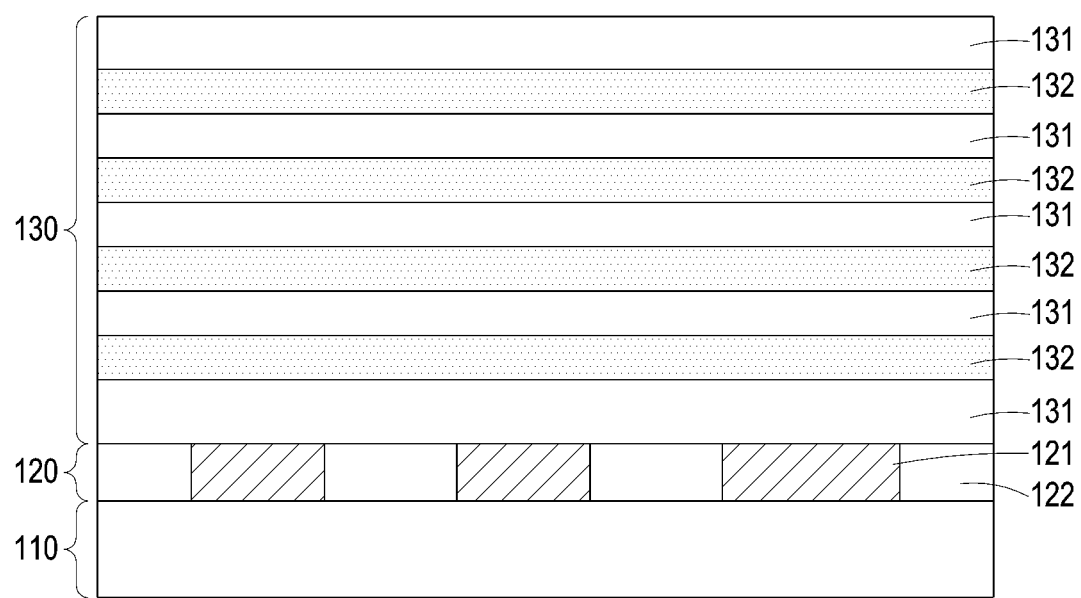

FIG. 3B is a cross-sectional view taken along a line A-A' of FIG. 3A.

Referring to FIGS. 3A and 3B, a lower structure 120 and an upper structure 130 may be sequentially formed over a peripheral circuit 110.

The peripheral circuit 110 may be made of a material suitable for semiconductor processing. The peripheral circuit 110 may include at least one among a conductive material, a dielectric material, and a semiconductive material. Various materials may be formed in the peripheral circuit 110. The peripheral circuit 110 may include a semiconductor substrate, and the semiconductor substrate may be formed of a material containing silicon. For example, the peripheral circuit 110 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The peripheral circuit 110 may include other semiconductor materials, such as germanium. The peripheral circuit 110 may include a group III/V semiconductor substrate, such as a compound semiconductor substrate, e.g., GaAs. The peripheral circuit 110 may include a Silicon-On-Insulator (SOI) substrate.

According to another embodiment of the present invention, the peripheral circuit 110 may include a semiconductor substrate and a plurality of integrated circuits formed over the semiconductor substrate. For example, the peripheral circuit 110 may include a plurality of control circuits. A control circuit of the peripheral circuit 110 may include at least one of an N-channel transistor, a P-channel transistor, a CMOS circuit, an address decoder circuit, a read circuit, a write circuit, a planar channel transistor, a recess channel transistor, a buried gate transistor, a fin channel transistor (FinFET) and the like. In an embodiment, at least one control circuit of the peripheral circuit 110 may include an N-channel transistor, a P-channel transistor, a CMOS circuit, or a combination thereof, at least one control circuit of the peripheral circuit 110 may include an address decoder circuit, a read circuit, a write circuit, and the like, and at least one control circuit of the peripheral circuit 110 may include a planar channel transistor, a recess channel transistor, a buried gate transistor, a fin channel transistor (FinFET) and the like.

Although not shown, the peripheral circuit 110 may include a sense amplifier SA, and the sense amplifier SA may be coupled to a multi-level metal wire (MLM).

The lower structure 120 may include an etch stop layer 121 and a lower inter-layer dielectric layer 122. The etch stop layer 121 may include a material having an etch selectivity during a process of etching the subsequent upper structure 130. For example, the etch stop layer 121 may include a polysilicon layer. The etch stop layer 121 may be formed by depositing a polysilicon layer and etching the polysilicon layer to form a plurality of etch stop layer islands (i.e., spaced apart regions) formed over the peripheral circuit 110 spaced apart from each other.

After forming the etch stop layer 121 with the plurality of islands over the peripheral circuit 110, a lower inter-layer dielectric layer 122 may be formed to fill the intervals between the islands of the etch stop layer 121. The lower inter-layer dielectric layer 122 may be formed by depositing a dielectric material over the peripheral circuit 110 including the etch stop layer 121 and then performing a planarization.

The lower inter-layer dielectric layer 122 may include for example an oxide.

The upper structure 130 may include a first and second material layers 131 and 132. The upper structure 130 may include a plurality of first material layers 131 and a plurality of second material layers 132. The upper structure 130 may be an alternating stack in which the first material layers 131 and the second material layers 132 are alternately stacked. The first material layers 131 and the second material layers 132 may be different materials. The first material layers 131 and the second material layers 132 may have different etching selectivities.

In an embodiment, the first material layers 131 may include silicon oxide, and the second material layers 132 may include silicon nitride. The stack of the first material layers 131 and the second material layers 132 may be referred to as an 'Oxide-Nitride (ON) stack', and the upper structure 130 may include at least one ON stack. The number of ON stacks may be set to correspond to the number of memory cells.

The first material layers 131 may be positioned at the lowermost portion and the uppermost portion of the upper structure 130, individually. The lowermost first material layers 131 and the uppermost first material layers 131 may be thicker than the remaining first material layers 131. The first material layers 131 and the second material layers 132 except for the lowermost first material layers 131 and the uppermost first material layers 131 may have the same thickness.

Hereinafter, in the plan views, the reference numeral of the lower structure 120 between the peripheral circuit 110 and the upper structure 130 will be omitted.

Figure 4A:
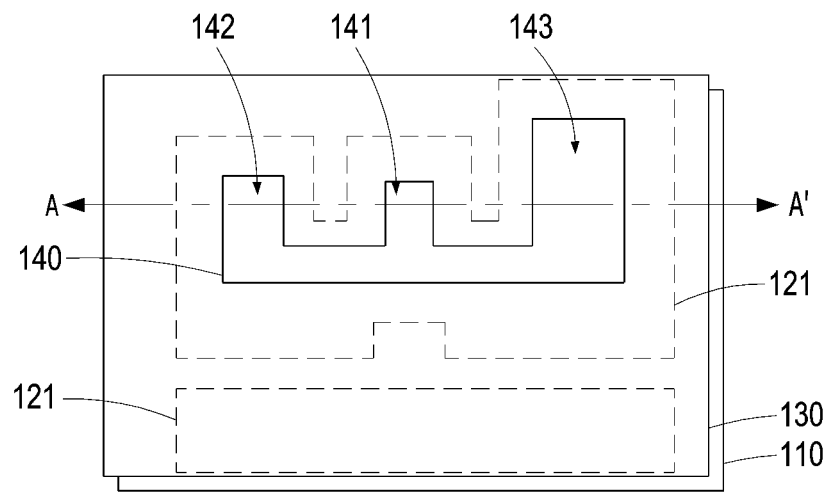
Figure 4B:
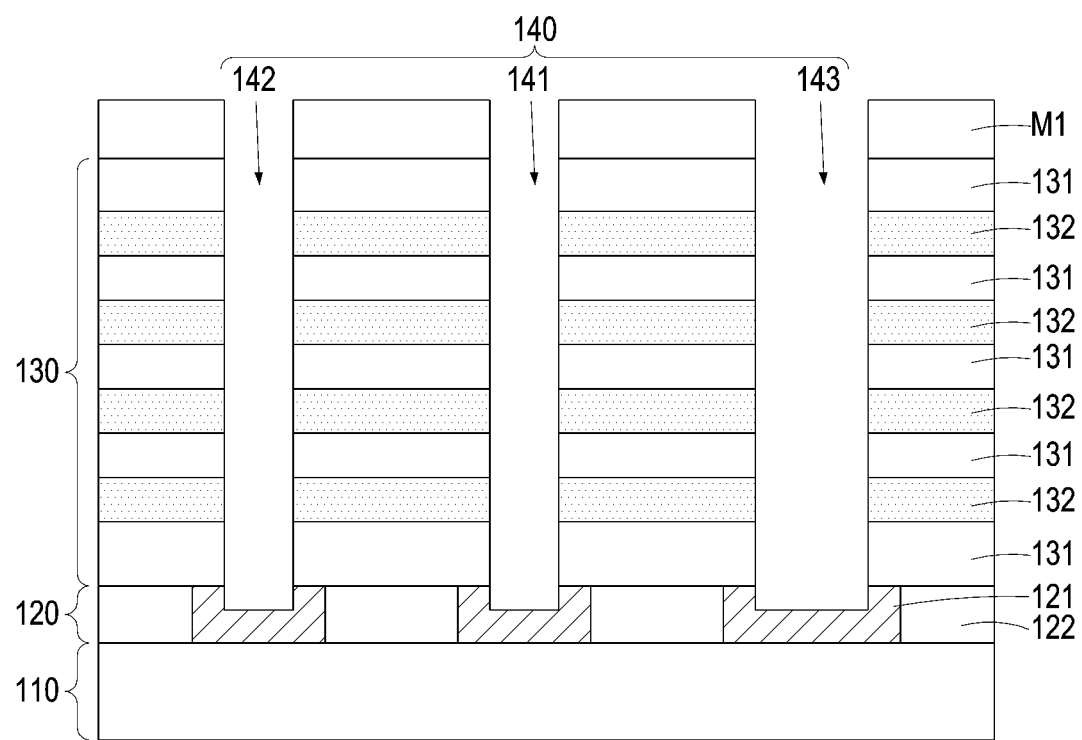

FIG. 4B is a cross-sectional view taken along the line A-A' of FIG. 4A. Referring to FIGS. 4A and 4B, a portion (i.e., the first region) of the upper structure 130 may be etched using a first mask M1. The process of etching the first region of the upper structure 130 may be performed to stop at the etch stop layer 121. As a result, a plurality of cell openings 140 penetrating through the upper structure 130 may be formed. The first region of the upper structure 130 may be dry etched to form the cell openings 140.

The first mask M1 may be an etch barrier during the process of etching the upper structure 130. The first mask M1 may include a photoresist pattern. According to another embodiment of the present invention, the first mask M1 may include a hard mask material. The first mask M1 may include amorphous carbon or polysilicon.

In order to prevent the cell openings 140 from not being opened, the process of etching the cell openings 140 may include an overetching. As a result, the bottom of the cell opening 140 may partially extend into the islands of the etch stop layer 121. In other words, a recessed surface may be formed on the surface of each of the islands of the etch stop layer 121.

The cell opening 140 is a vertical opening vertically oriented from the lower structure 120 and may extend vertically to upper surface of the etch stop layer 121 and through the upper structure 130. Sidewalls of the cell openings 140 may have a vertical profile. The cell opening 140 may refer to a region in which a part of a plurality of memory cells are to be formed.

From the perspective of a top view, the cell opening 140 may include a plurality of fingers. The cell opening 140 may be a finger-shaped opening. For example, the cell opening 140 may include a first finger 141, a second finger 142, and a third finger 143. Hereinafter, the first finger 141 may be referred to as a first cell opening 141, and the second finger 142 may be referred to as a second cell opening 142, and the third finger 143 may be referred to as a third cell opening 143.

The first cell opening 141, the second cell opening 142, and the third cell opening 143 may be coupled to each other as shown in FIG. 4A. The first cell opening 141 may provide a space in which an active body is to be formed, the second cell opening 142 may provide a space in which a bit line is to be formed, and the third cell opening 143 may define a space in which a capacitor is to be formed. The first cell opening 141 may be referred to as an 'active body opening', and the second cell opening 142 may be referred to as a 'bit line opening'. The third cell opening 143 may be referred to as a 'capacitor opening'.

From the perspective of a top view, the first cell opening 141 may be positioned in the center, the second cell opening 142 may be positioned on one side (or the left side) of the first cell opening 141, and the third cell opening 143 may be positioned on the other side (or the right side) of the first cell opening 141. An open area of the third cell opening 143 may be larger than the first cell opening 141 and the second cell opening 142. Since the third cell opening 143 is formed relatively large, the size of the capacitor formed subsequently may be increased. As a result, the capacitance may be sufficiently secured.

As described above, the cross section of the cell opening 140 may have a multi-finger shape. The first cell opening 141, the second cell opening 142, and the third cell opening 143 may be arranged side by side in a multi-finger shape. From a top view, the cell opening 140 may have an elongated part extending in the first direction D1 with the three fingers 141, 142, and 143 projecting laterally in the third direction D3 from the elongated part.

The second material layers 132 may be replaced with the active layers 151 by the following series of processes. Portions of the active layers 151 may be replaced with the channel body 157, the bit line contact node 183, and the storage nodes 192.

Figure 5A:
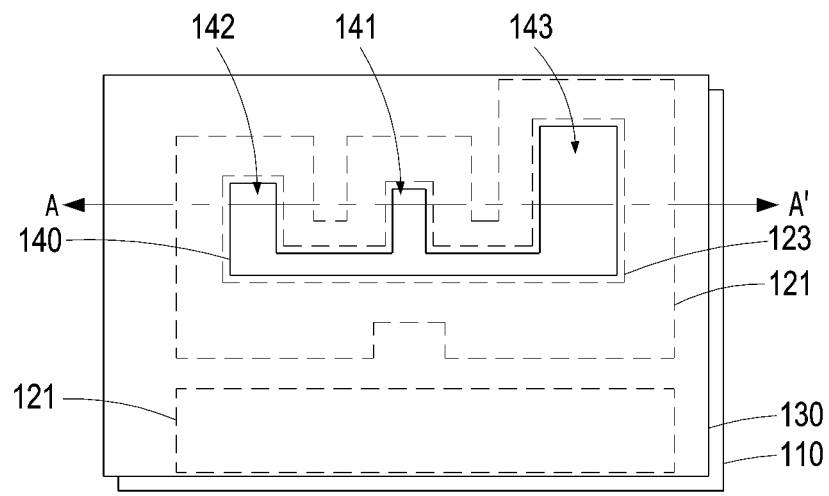
Figure 5B:
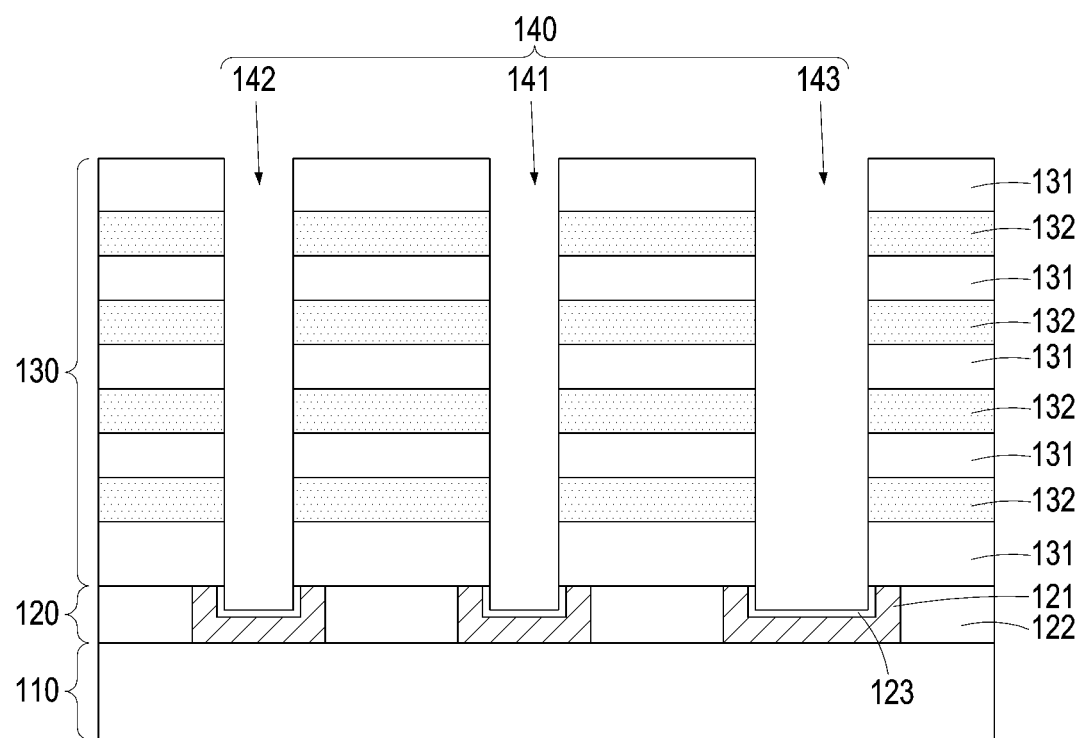

FIG. 5B is a cross-sectional view taken along the line A-A' of FIG. 5A. Referring to FIGS. 5A and 5B, the protective layer 123 may be formed by oxidizing the recessed surfaces of the etch stop layer 121. The protective layer 123 may be formed by exposing the recessed surfaces of the etch stop layer 121 to a thermal oxidation process. For example, when the etch stop layer 121 includes polysilicon, the protective layer 123 may be formed of silicon oxide. The protective layer 123 may protect the etch stop layer 121 in a subsequent process. Also, the protective layer 123 may electrically insulate the subsequent bit lines and the capacitors from the etch stop layer 121.

The protective layer 123 may not fill the bottom of the cell opening 140, that is, the recessed surface of the etch stop layer 121. The protective layer 123 may be formed conformally on the recessed surface of the etch stop layer 121.

Figure 6A:
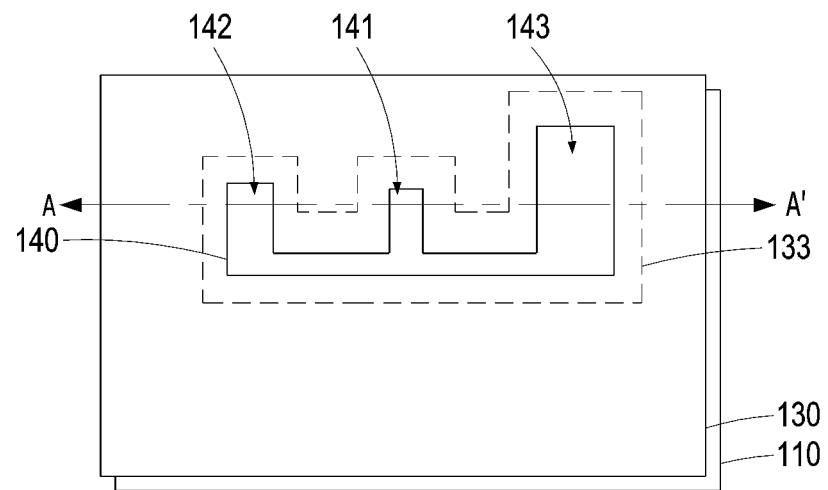
Figure 6B:
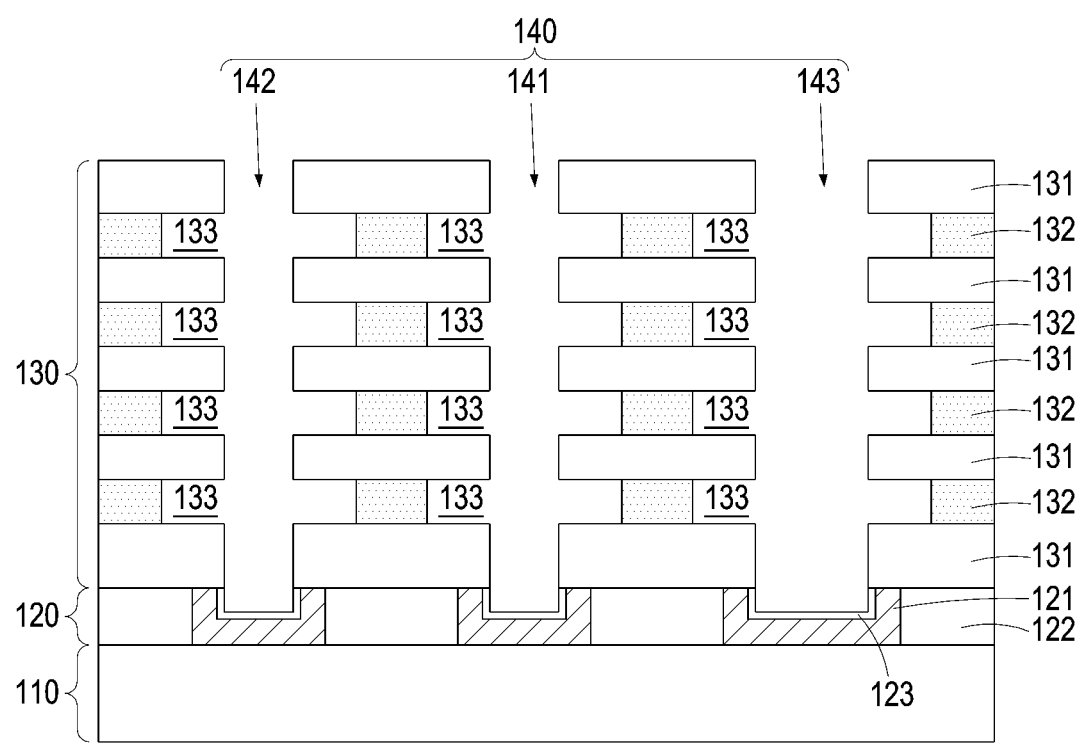

FIG. 6B is a cross-sectional view taken along the line A-A' of FIG. 6A. Referring to FIGS. 6A and 6B, a portion of the upper structure 130 may be selectively recessed through the cell opening 140. For example, the second material layers 132 of the upper structure 130 may be selectively laterally recessed. A plurality of lateral recesses 133 may be formed in the upper structure 130 by lateral recessing (e.g., etching) the second material layers 132. The lateral recesses 133 may be formed between the first material layers 131 that are stacked vertically. The lateral recessing of the second material layers 132 may be performed by wet etching or dry etching. For example, when the second material layers 132 include silicon nitride, the lateral recesses 133 may be formed by wet-etching silicon nitride.

The lateral recesses 133 may extend laterally from the sides of the first to third cell openings 141, 142, and 143 into the upper structure 130. As a result, the lateral recesses 133 may extend from the sides of the first cell opening 141, the second cell opening 142, and the third cell opening 143 individually.

Figure 7A:
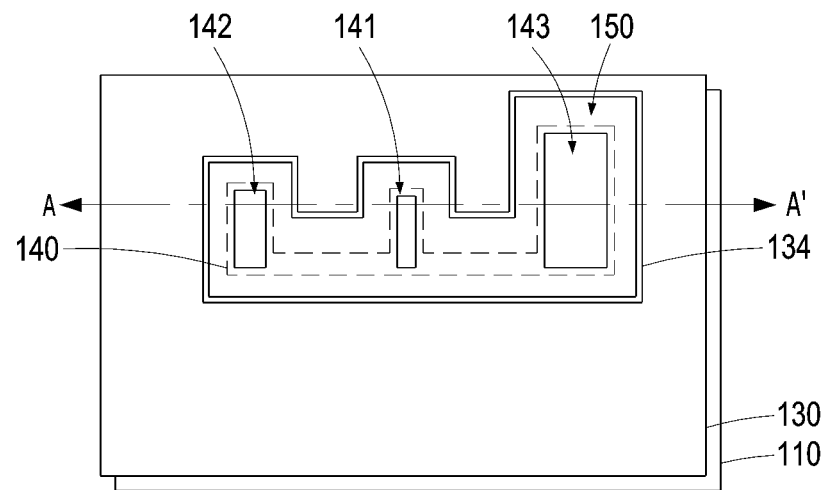
Figure 7B:
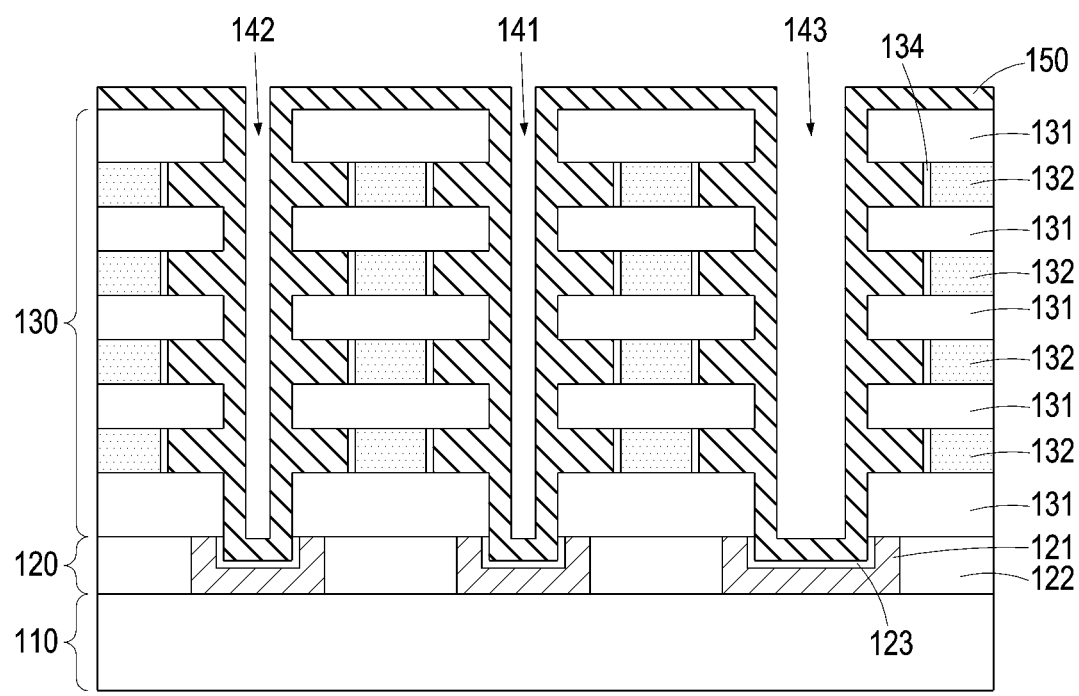

FIG. 7B is a cross-sectional view taken along the line A-A' of FIG. 7A. Referring to FIGS. 7A and 7B, the sides of the second material layers 132 may be selectively oxidized. As a result, the sidewalls of the lateral recesses 133 may be covered with selective oxides 134. For example, when the second material layers 132 include silicon nitride, the selective oxides 134 may include silicon oxynitride.

Subsequently, an active material 150 may be deposited. The active material 150 may fill the lateral recesses 133. The active material 150 may cover the sidewalls of the first to third cell openings 141, 142 and 143, but may not fill the first to third cell openings 141, 142 and 143. In other words, the active material 150 may conformally cover the sidewalls of the first to third cell openings 141, 142, and 143 while filling the lateral recesses 133. Each of the selective oxides 134 may be positioned between the active material 150 and the second material layers 132. The active material 150 may include a semiconductor material. The active material 150 may include polysilicon. The active material 150 may include P-type polysilicon or undoped polysilicon. The thickness of the active material 150 may be adjusted to fill the lateral recesses 133 without voids.

Figure 8A:
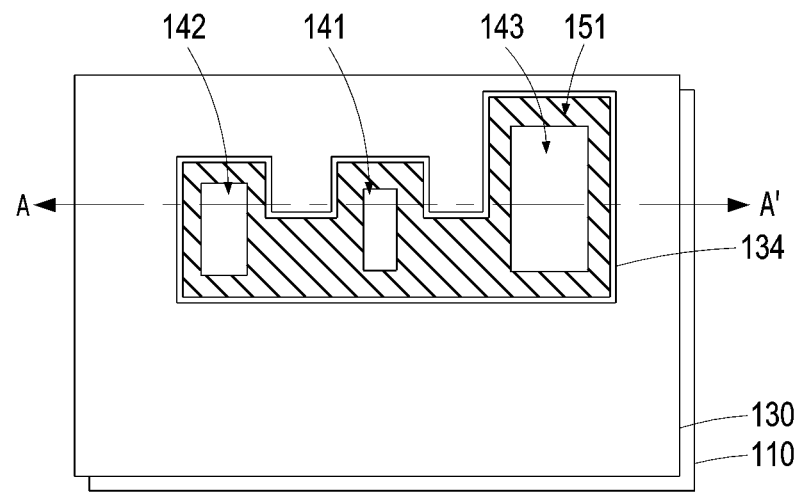
Figure 8B:
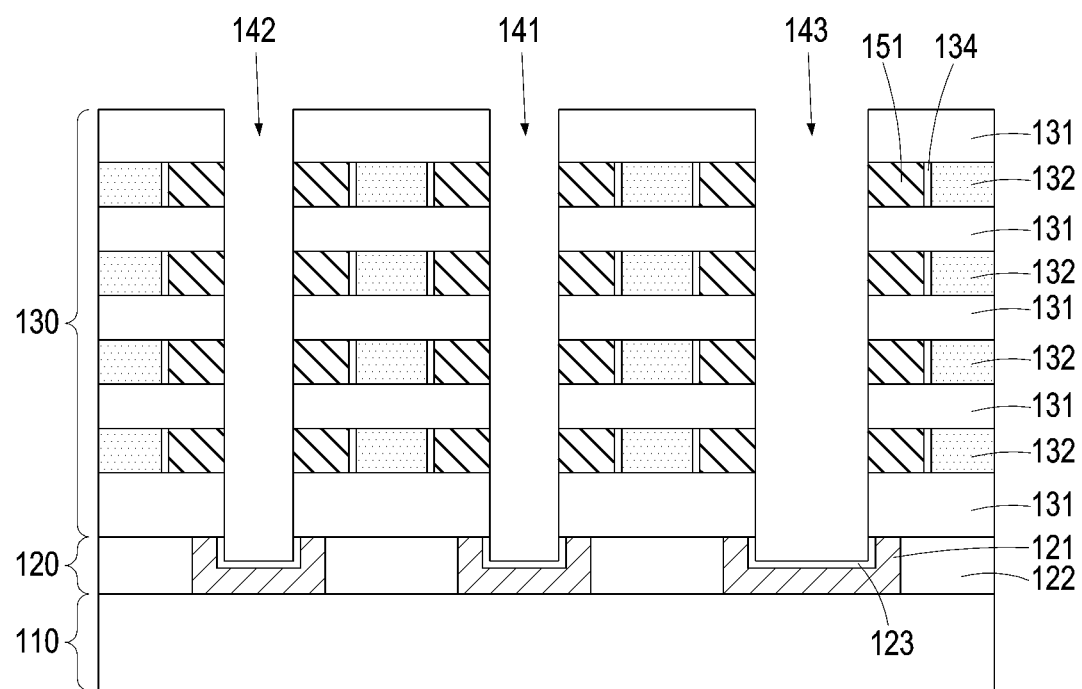

FIG. 8B is a cross-sectional view taken along the line A-A' of FIG. 8A. Referring to FIGS. 8A and 8B, an active isolation process may be performed. For example, the active material 150 may be selectively etched to form active layers 151 in the lateral recesses 133, respectively. The active layers 151 respectively formed in the lateral recesses 133 may be vertically isolated from each other. The sidewalls of the active layers 151 may be covered with the selective oxides 134, respectively. The selective oxides 134 may be positioned between the active layers 151 and the second material layers 132, respectively.

From the perspective of a top view, the active layers 151 may have a closed loop-shape. Accordingly, the first cell opening 141, the second cell opening 142, and the third cell opening 143 may be formed to penetrate through the active layers 151 stacked vertically. The active layers 151 may include a plurality of fingers. Each of the fingers may penetrate through the first to third cell openings 141 to 143 therein.

Figure 9A:
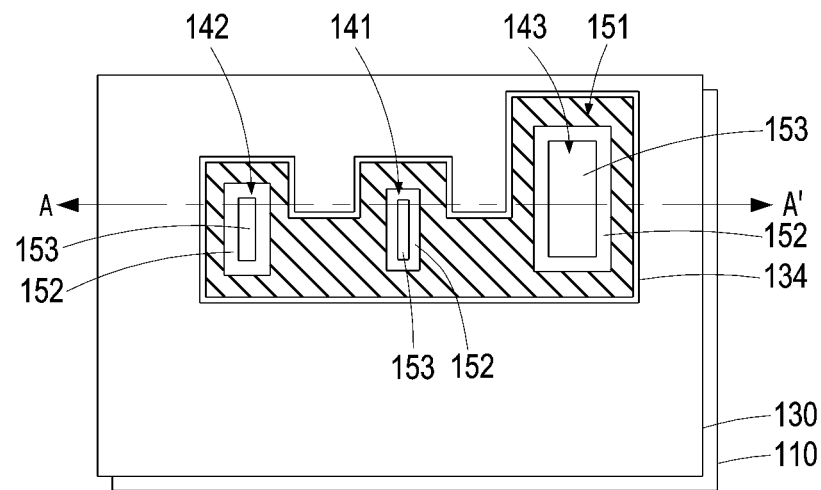
Figure 9B:
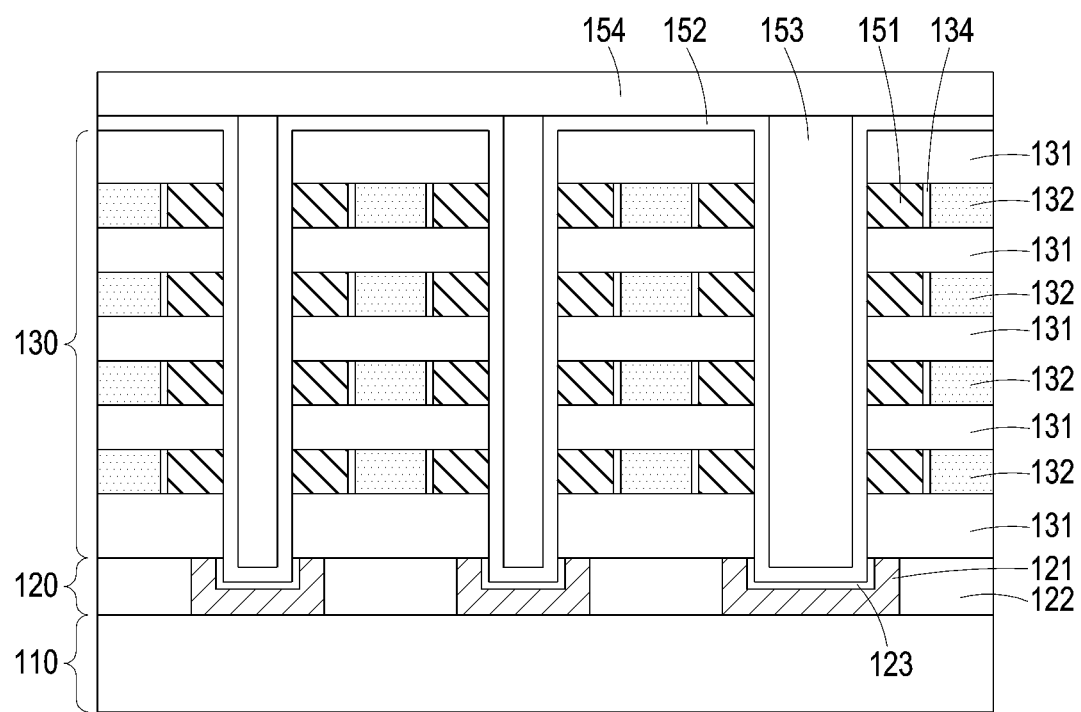

FIG. 9B is a cross-sectional view taken along the line A-A' of FIG. 9A. Referring to FIGS. 9A and 9B, a sacrificial liner layer 152 may be formed to protect the active layer 151. The sacrificial liner layer 152 may include a dielectric material. For example, the sacrificial liner layer 152 may be formed of silicon nitride or silicon oxide.

A sacrificial material 153 may be formed over the sacrificial liner layer 152. The sacrificial material 153 may fill the first to third cell openings 141, 142, and 143 over the sacrificial liner layer 152. The sacrificial material 153 may contain a metal-based material. The sacrificial material 153 may include a metal and a metal nitride. The sacrificial material 153 may include tungsten. The sacrificial material 153 may be planarized to remain only inside the first to third cell openings 141, 142, and 143.

An upper inter-layer dielectric layer (ILD) 154 may be formed over the sacrificial material 153. The upper inter-layer dielectric layer 154 may include silicon oxide.

As described above, a plurality of active layers 151 may be formed in the upper structure 130. The active layers 151 and the first material layers 131 may be alternately stacked vertically. The sides of the active layers 151 may be surrounded by the second material layers 132, respectively. The upper structure 130 may be referred to as a mold structure, and the mold structure may include an alternating stack in which the active layers 151 and the first material layers 131 are alternately stacked vertically.

Figure 10A:
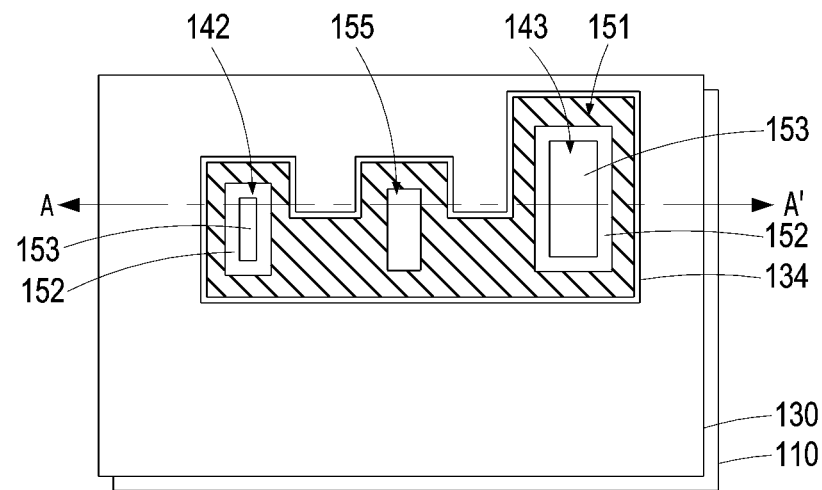
Figure 10B:
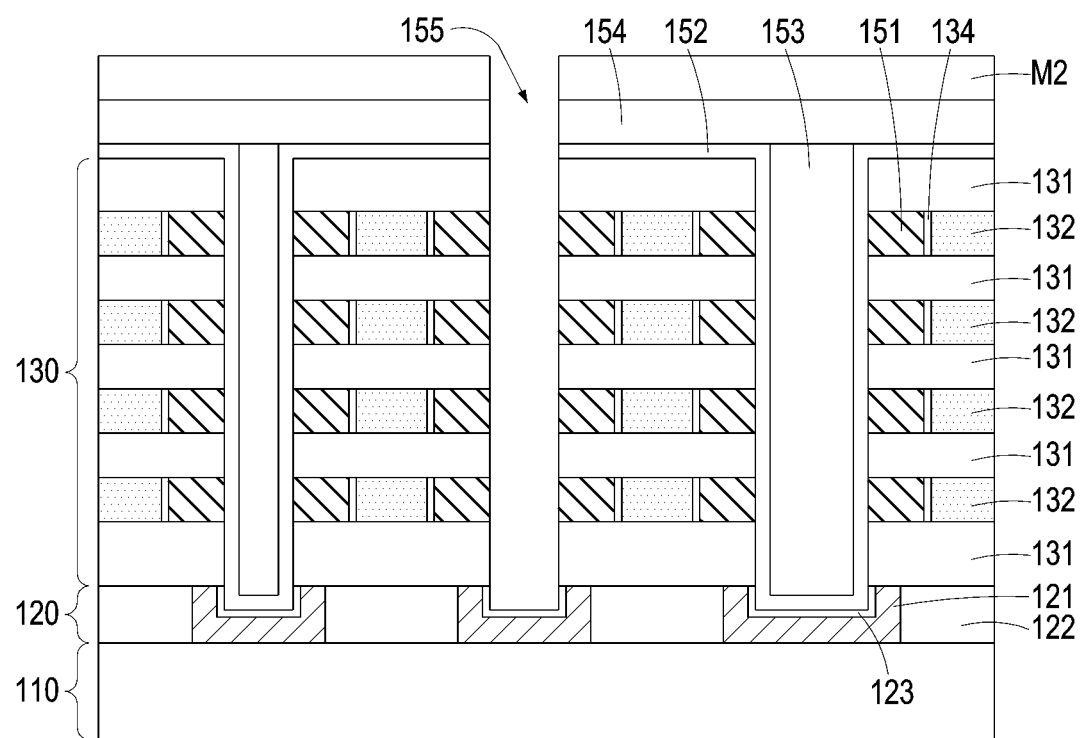

FIG. 10B is a cross-sectional view taken along the line A-A' of FIG. 10A. Referring to FIGS. 10A and 10B, the first cell opening 141 may be exposed again. To this end, the sacrificial liner layer 152 and the sacrificial material 153 filling the first cell opening 141 may be selectively removed. For example, a portion of the upper inter-layer dielectric layer 154 may be etched by using a second mask M2 to expose a portion corresponding to the first cell opening 141, and then the sacrificial liner layer 152 and the sacrificial material 153 filling the first cell opening 141 may be etched.

As described above, the exposed first cell opening 141 may be simply referred to as 'an active body opening 155'. A portion of each active layer 151 may be exposed by the active body opening 155.

The active body opening 155 may be oriented perpendicular to the lower structure 120.

Figure 11A:
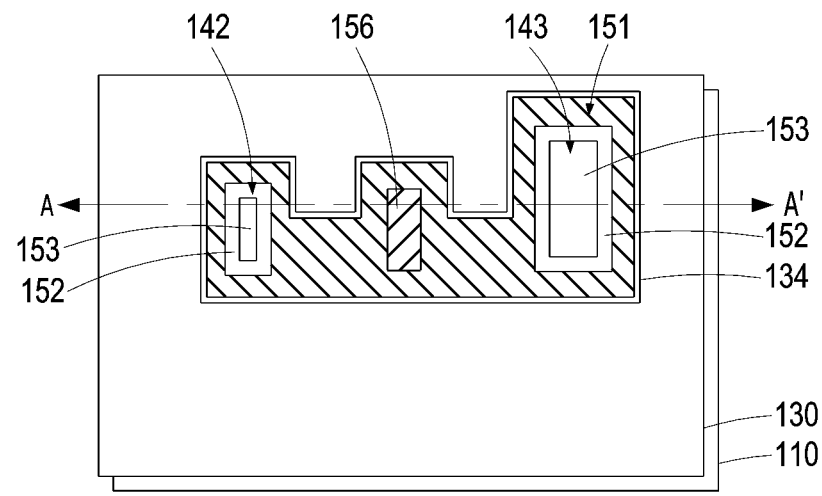
Figure 11B:
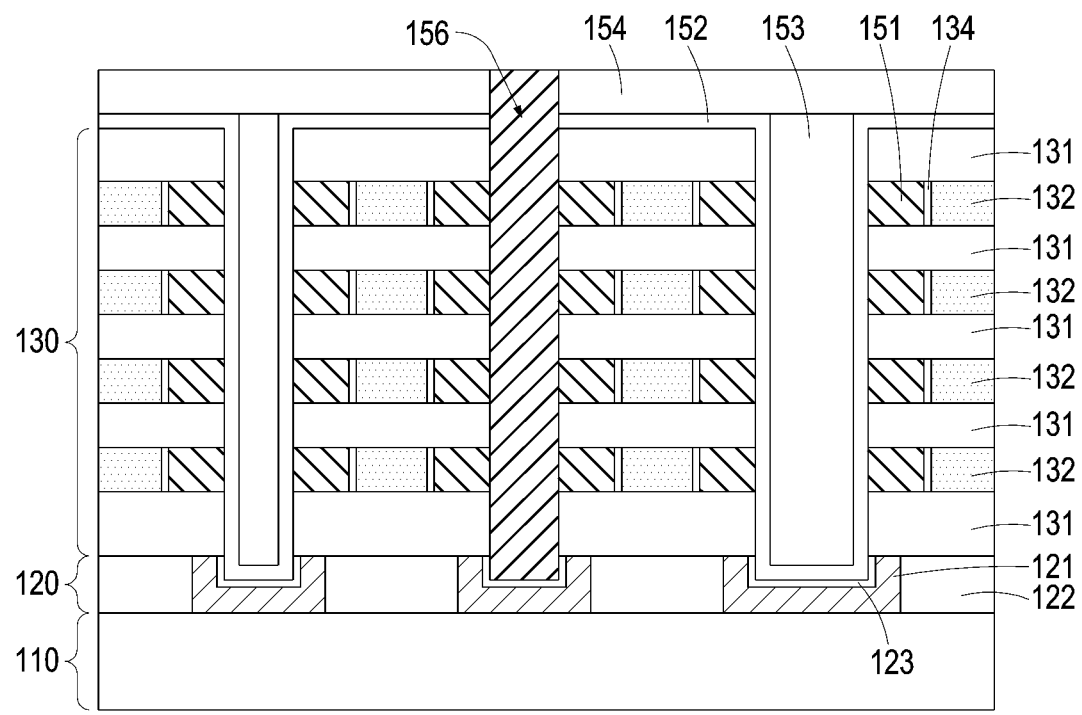

FIG. 11B is a cross-sectional view taken along the line A-A' of FIG. 11A. Referring to FIGS. 11A and 11B, after removing the second mask M2, the active body opening 155 may be filled with the active body 156. The active body 156 may include P-type polysilicon. The active body 156 may be formed by depositing the P-type polysilicon to fill the active body opening 155 and performing planarization. A portion of the sacrificial material 153 and the sacrificial liner layer 152 may be planarized during the planarization of the P-type polysilicon.

The active body 156 may interconnect the active layers 151 that are positioned vertically. A body bias may be applied to the active body 156. The active body 156 may have a pillar shape. The active body 156 may penetrate through the active layers 151 that are stacked vertically.

Figure 12A:
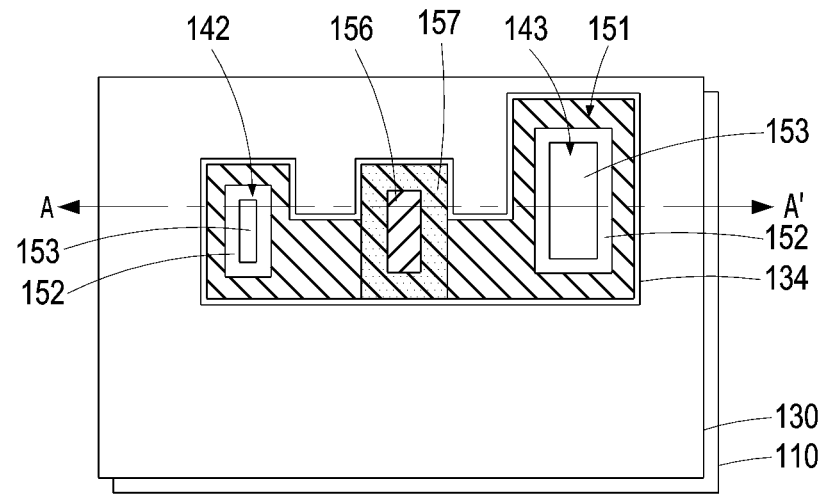
Figure 12B:
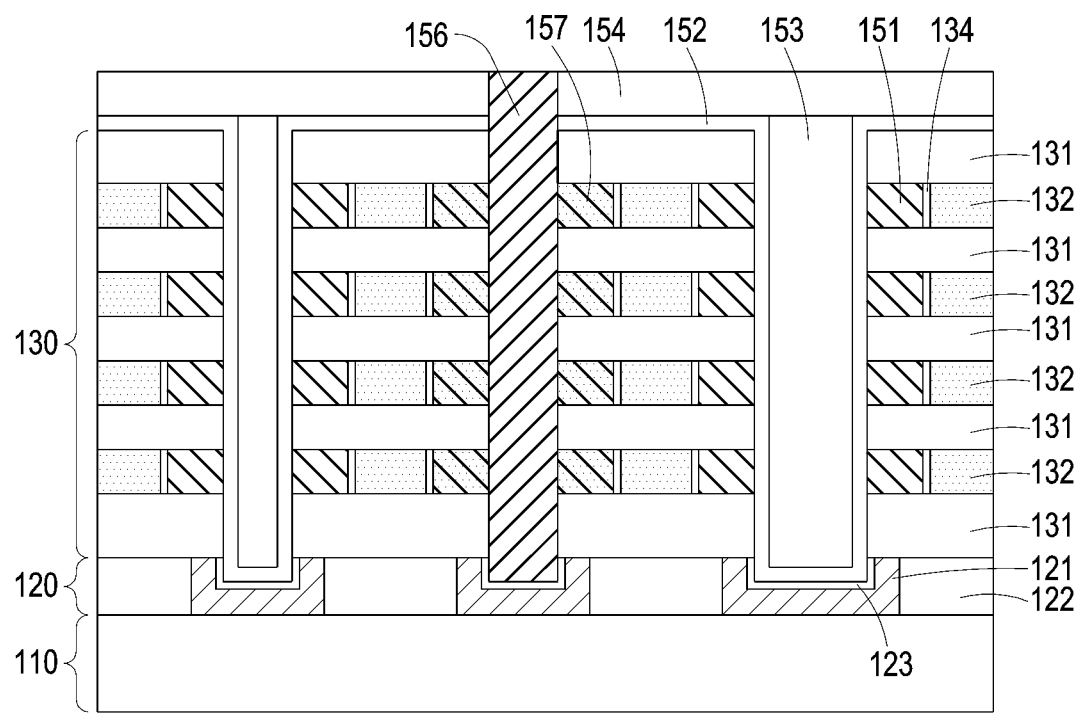

FIG. 12B is a cross-sectional view taken along the line A-A' of FIG. 12A. Referring to FIGS. 12A and 12B, when the active layer 151 includes undoped polysilicon, a heat treatment process may be subsequently performed to diffuse a P-type impurity from the active body 156. Accordingly, a portion of the active layers 151 in contact with the active body 156 may be doped with the P-type impurity. A portion of the active layers 151 doped with the P-type impurity may be the channel body 157. The channel bodies 157 may be stacked vertically. At one level, the channel body 157 and the active layer 151 may be positioned at the same level.

From the perspective of a top view, the channel body 157 may have a surrounding shape surrounding the active body 156. The active body 156 may be shaped to penetrate through the vertically stacked channel bodies 157.

Figure 13A:
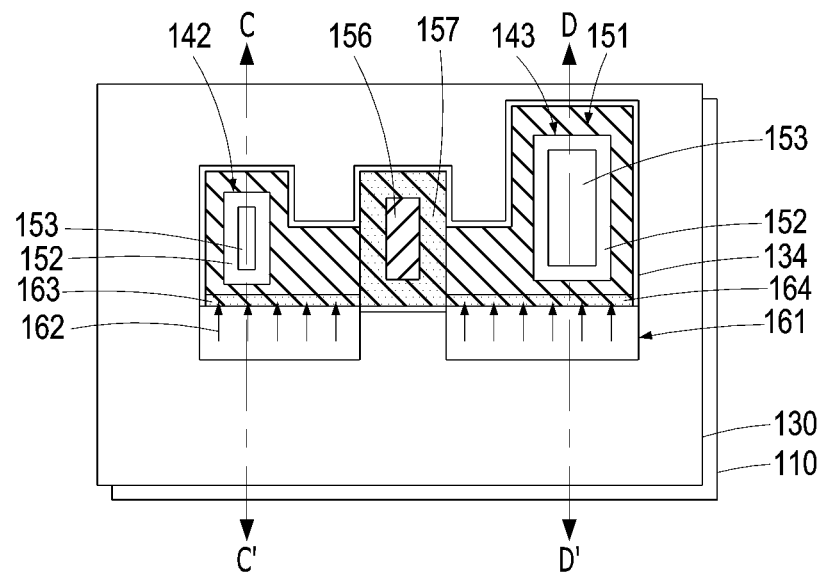
Figure 13B:
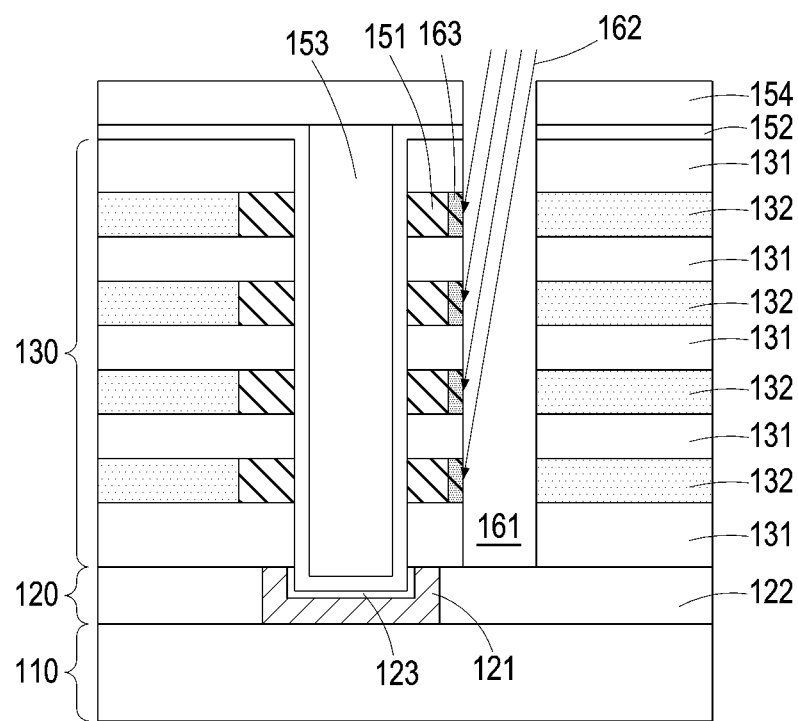
Figure 13C:
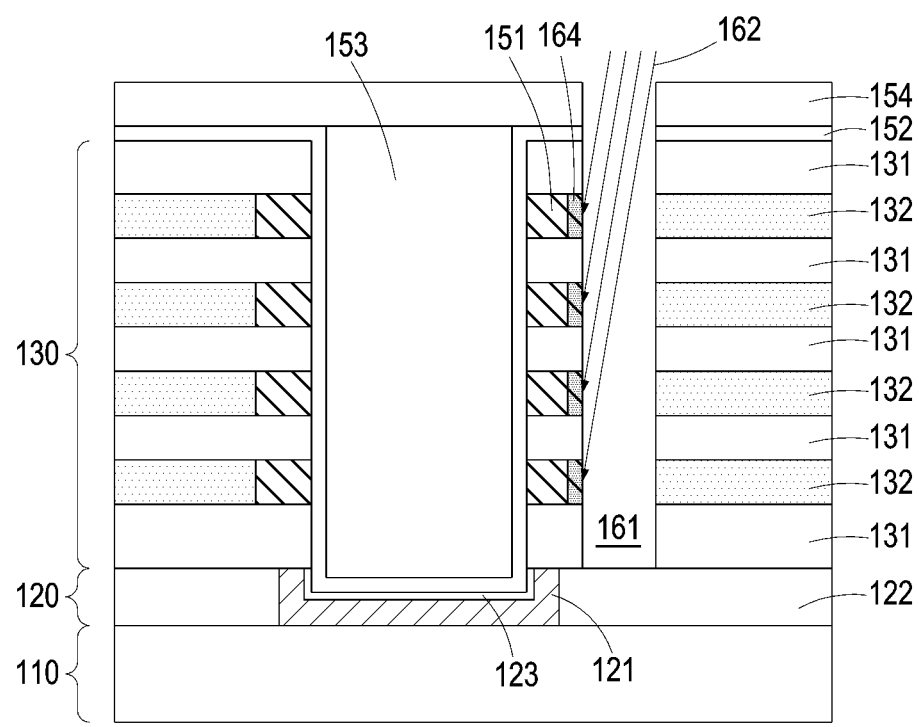

FIG. 13B is a cross-sectional view taken along a line C-C' of FIG. 13A, and FIG. 13C is a cross-sectional view taken along a line D-D' of FIG. 13A.

Referring to FIGS. 13A to 13C, an isolated opening 161 may be formed at a position spaced apart from the active layer 151. For example, after a third mask (not shown) is formed over the upper structure 130, a second region of the upper structure 130 (which is, herein, a portion where the first to third cell openings 141, 142 and 143 are not formed) may be etched using the third mask. As a result, a pair of isolated openings 161 that are isolated from each other as the upper inter-layer dielectric layer 154, a plurality of first material layers 131, and a plurality of second material layers 132 are etched, may be formed. When the isolated openings 161 are formed laterally spaced apart from the active layers 151, the second material layers 132 may be selectively recessed from the sidewalls of the isolated openings 161, thereby exposing one sides of the active layers 151. According to another embodiment of the present invention, an etching process for forming the isolated openings 161 may be performed such that the sidewalls of the isolated openings 161 expose one sides of the active layers 151. The isolated openings 161 may be vertically oriented in the stacking direction of the memory cells.

Subsequently, an impurity doping process 162 may be performed. An impurity may be doped onto the exposed portion of the active layers 151 through the isolated openings 161. As a result, the first and second source/drain regions 163 and 164 may be formed. The impurity doping process 162 may include an N-type impurity doping process. The first and second source/drain regions 163 and 164 may be N-type source/drain regions.

The first source/drain regions 163 may be portions to be coupled to bit lines subsequently, and the second source/drain regions 164 may be portions to be coupled to capacitors subsequently.

The impurity doping process 162 may be performed by tilt implantation. According to another embodiment of the present invention, the impurity doping process 162 may be performed by a plasma doping process.

The first source drain region 163 and the second source/drain region 164 may be laterally spaced apart from each other with the channel body 157 between them. Accordingly, a lateral channel may be defined in the channel body 157 between the first source drain region 163 and the second source/drain region 164.

Figure 14A:
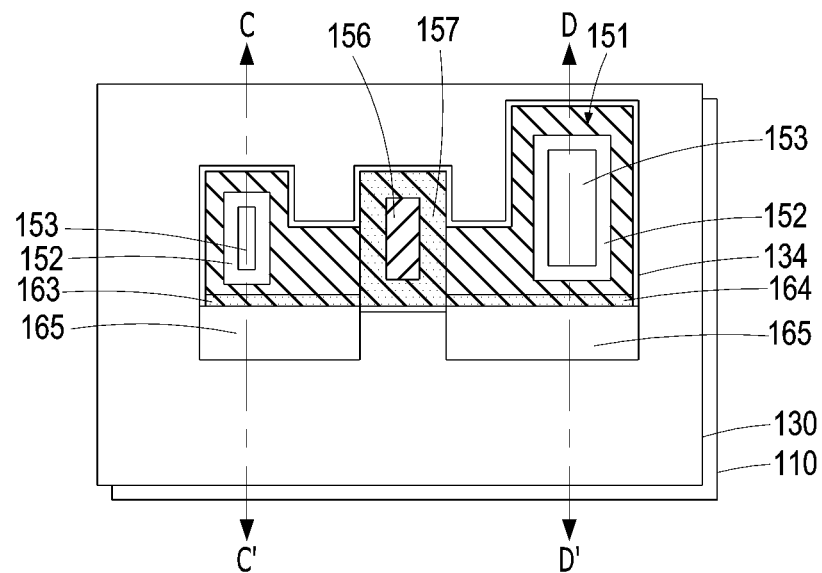
Figure 14B:
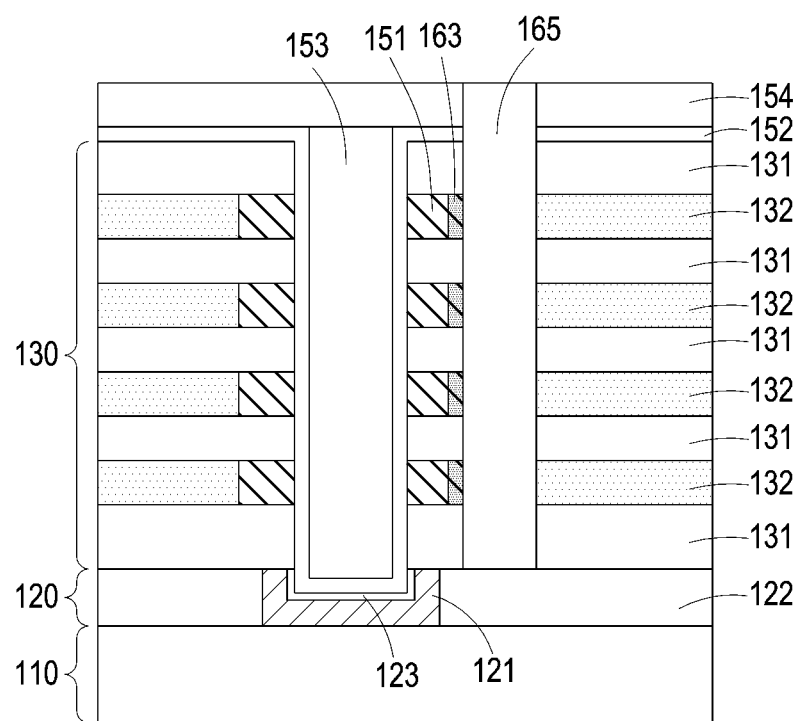
Figure 14C:
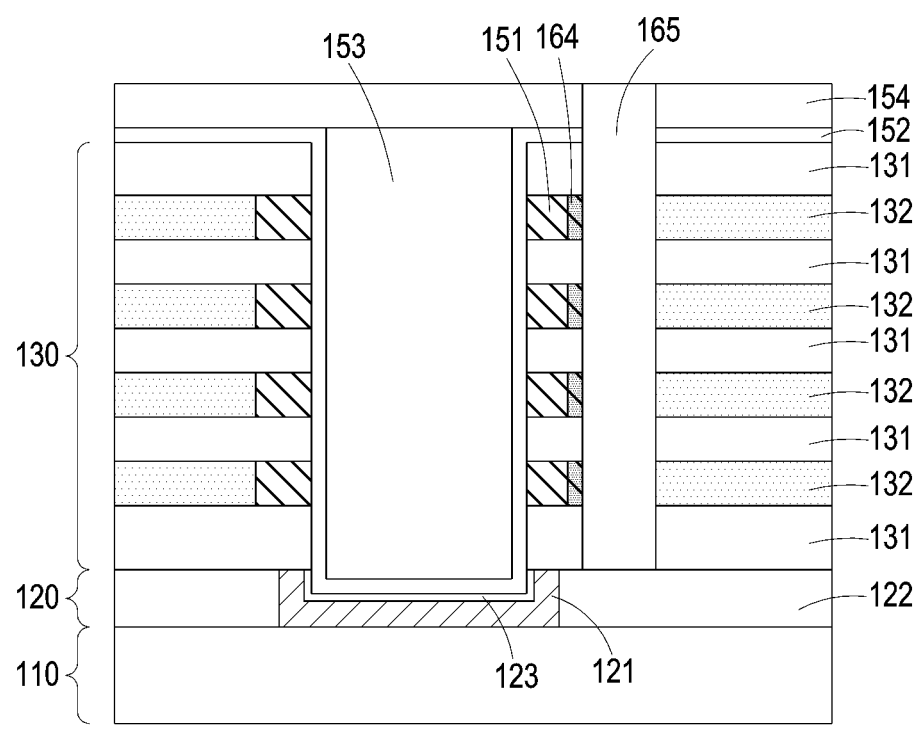

FIG. 14B is a cross-sectional view taken along the line C-C' of FIG. 14A, and FIG. 14C is a cross-sectional view taken along a line D-D' of FIG. 14A.

Referring to FIGS. 14A to 14C, an isolated opening 171 may be filled with the isolation dielectric layer 165. The isolation dielectric layer 165 may include silicon oxide. The isolation dielectric layer 165 may be oriented perpendicular to the lower structure 120. The isolation dielectric layer 165 may be referred to as a junction isolation layer. The isolation dielectric layer 165 may confront the first and second source/drain regions 163 and 164. The isolation dielectric layer 165 may be vertically oriented in the stacking direction of the memory cells.

Figure 15A:
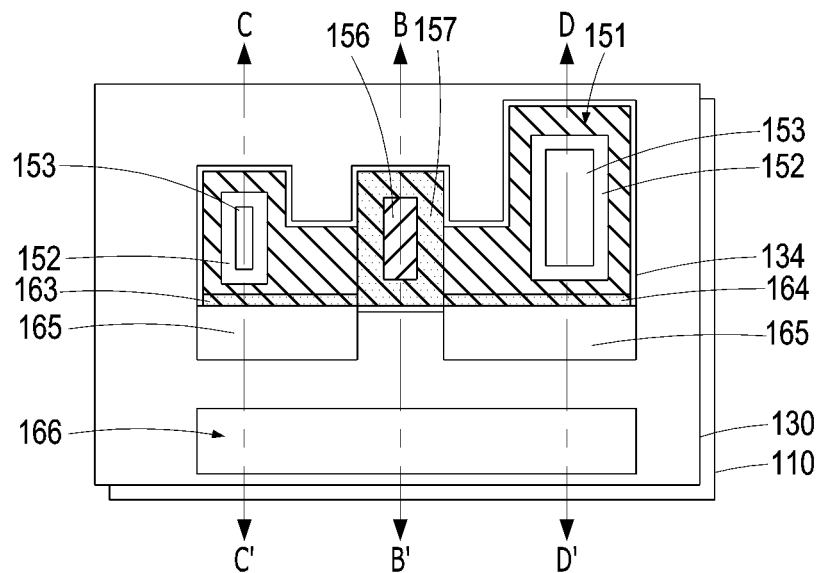
Figure 15B:
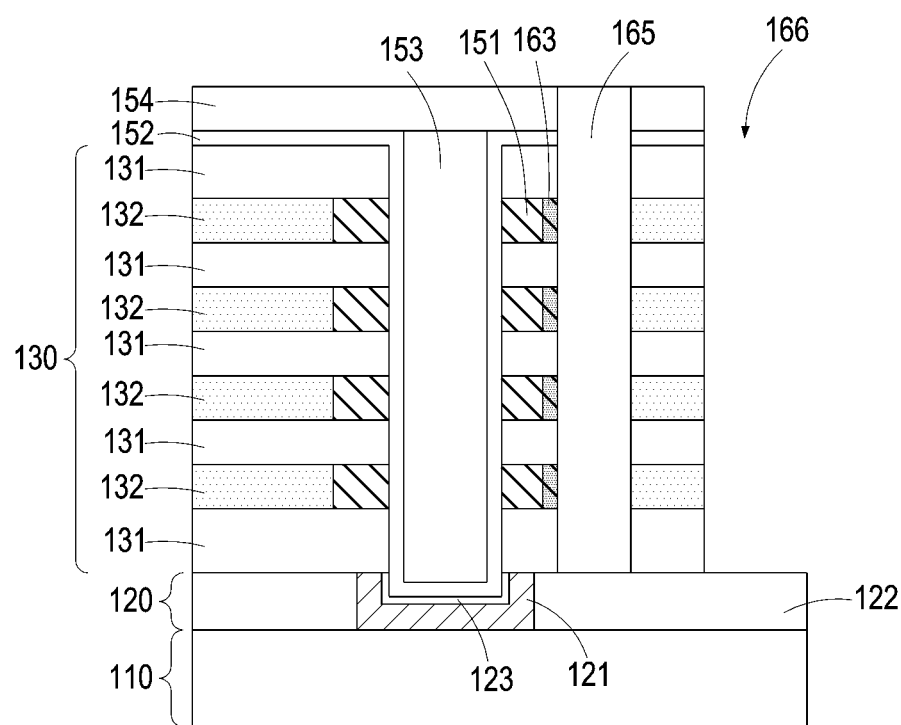
Figure 15C:
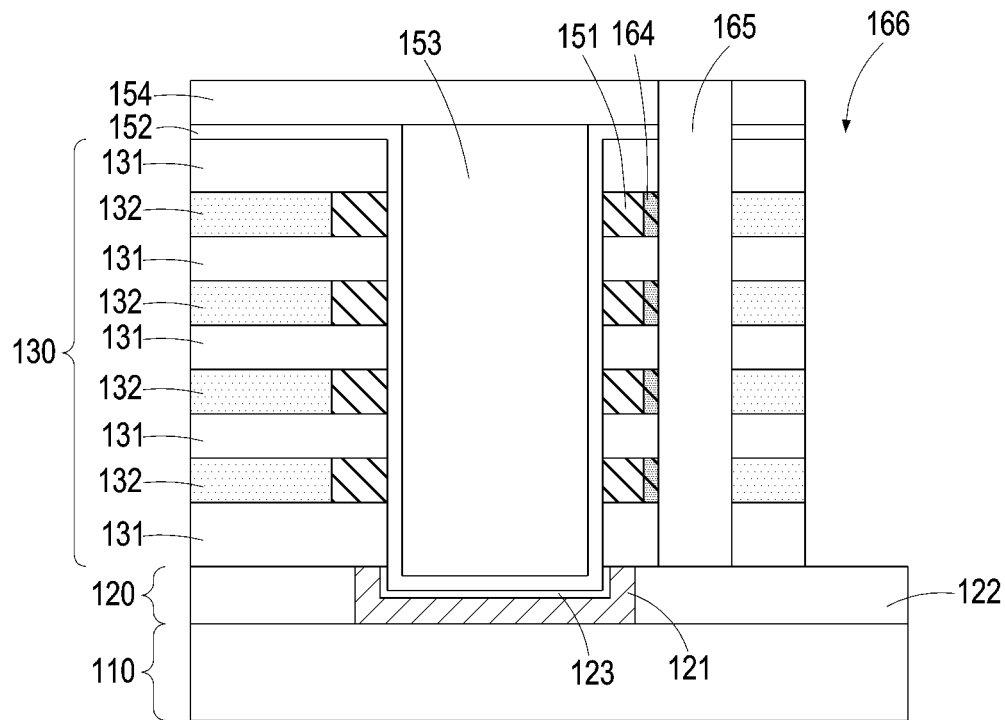
Figure 15D:
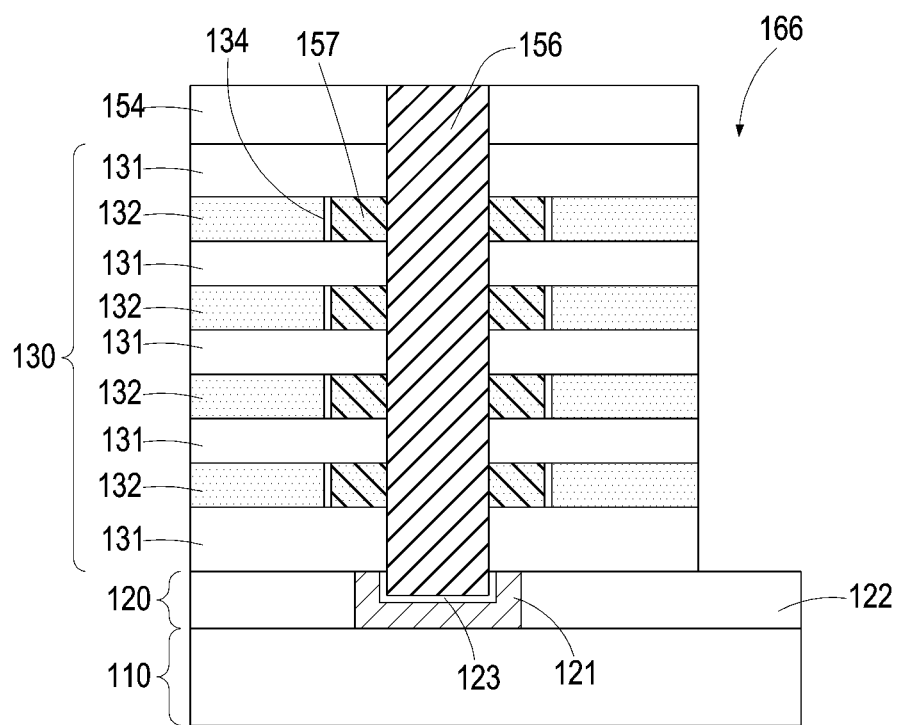

FIG. 15B is a cross-sectional view taken along the line C-C' of FIG. 15A, and FIG. 15C is a cross-sectional view taken along a line D-D' of FIG. 15A. FIG. 15D is a cross-sectional view taken along the line B-B' of FIG. 15A. Referring to FIGS. 15A to 15D, a slit 166 may be formed. The slit 166 may be formed around the isolation dielectric layer 165. The isolation dielectric layer 165 may be positioned between the active layers 151 and the slit 166. The slit 166 may be laterally spaced apart from the active layers 151.

The slit 166 may be formed by etching the third region of the upper structure 130. For example, the slits 166 may be formed in the third region of the upper structure 130 by etching the alternating stack of the upper inter-layer dielectric layer 154, the first material layers 131, and the second material layers 132. The bottom of the slit 166 may land on the top surface of the lower structure 120.

Figure 16A:
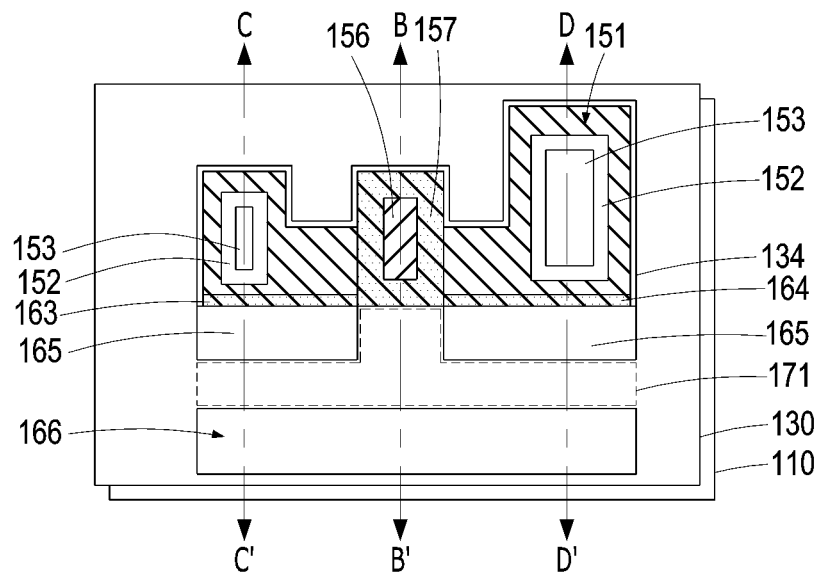
Figure 16B:
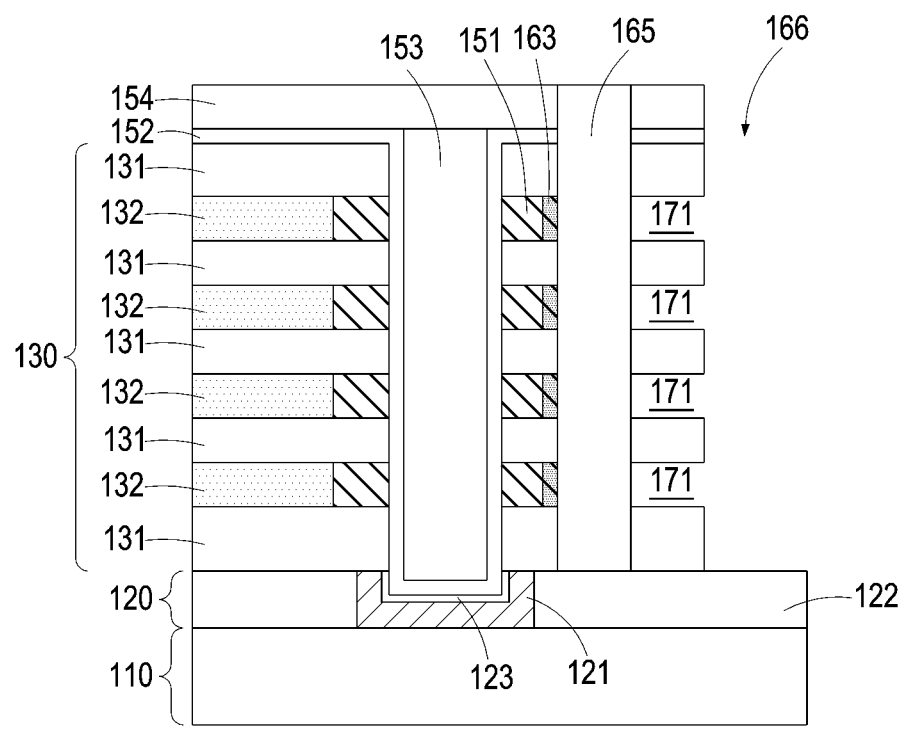
Figure 16C:
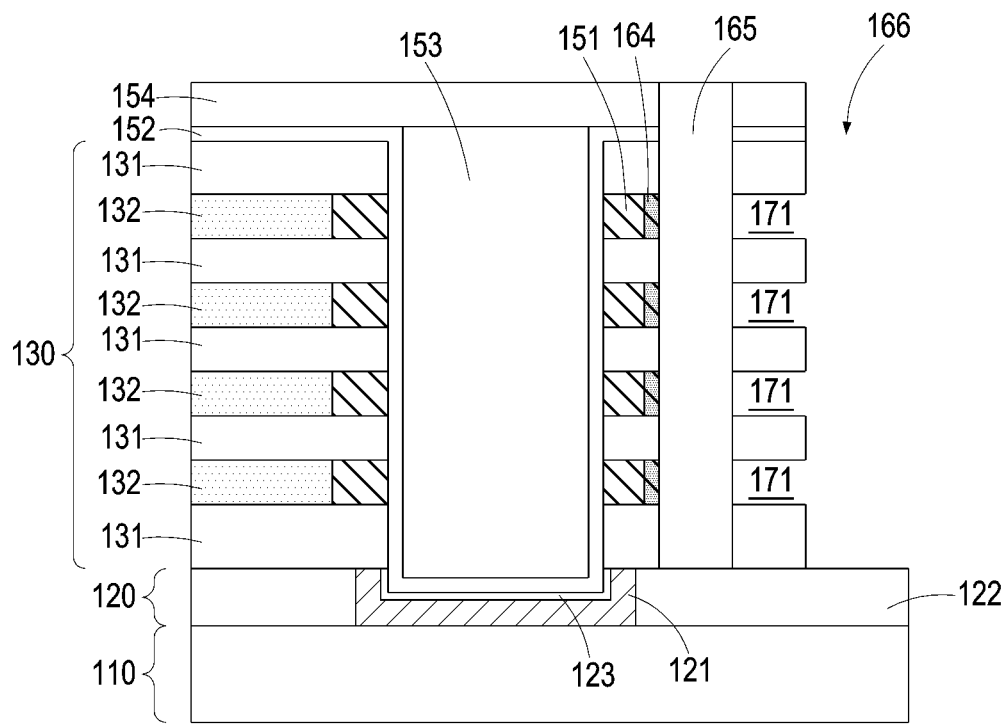
Figure 16D:
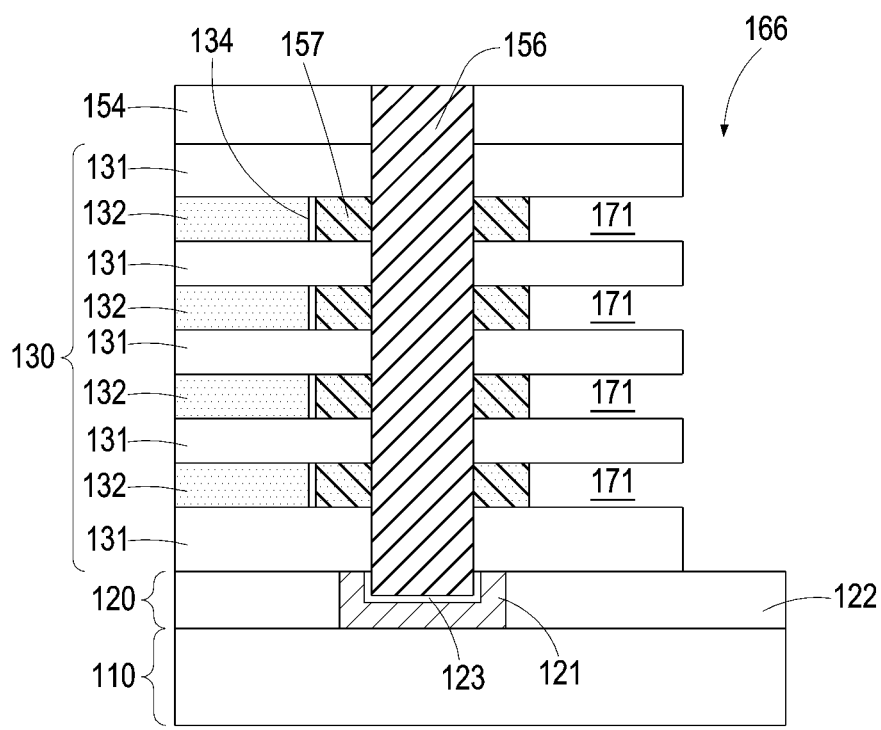

FIG. 16B is a cross-sectional view taken along the line C-C' of FIG. 16A, and FIG. 16C is a cross-sectional view taken along the line D-D' of FIG. 16A, and FIG. 16D is a cross-sectional view taken along the line B-B' of FIG. 16A.

Referring to FIGS. 16A to 16D, the second material layers 132 may be selectively stripped through the slit 166. As a result, the second material layers 132 may be selectively removed between the laterally isolation dielectric layers 165 that are positioned laterally. Also, the second material layers 132 may be selectively removed between the slit 166 and the isolation dielectric layers 165.

As described above, the lateral gate recesses 171 may be formed in a self-aligned manner between the first material layers 131 that are vertically stacked by the selective removal process of the second material layers 132.

A portion of the protective layer 134 may be exposed by the lateral gate recesses 171. After stripping the second material layers 132, a portion of the protective layer 134 may be removed to expose the channel bodies 157.

Figure 17A:
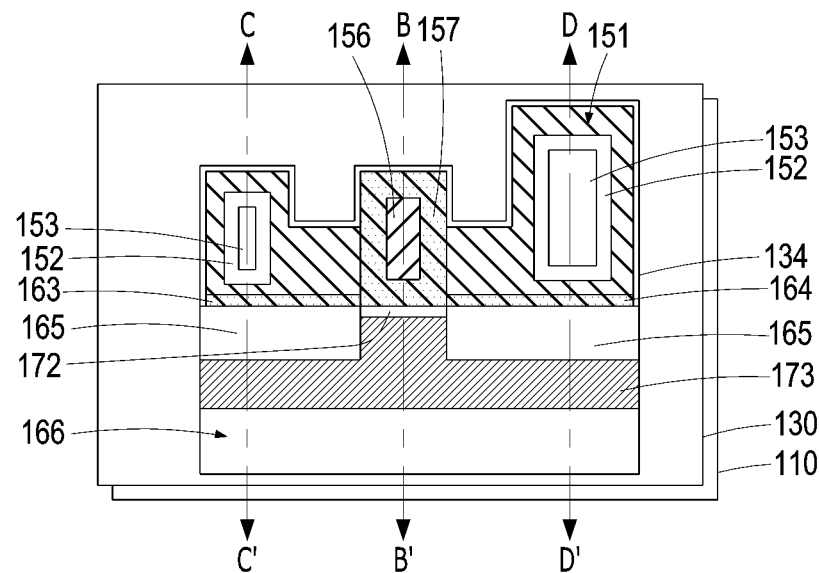
Figure 17B:
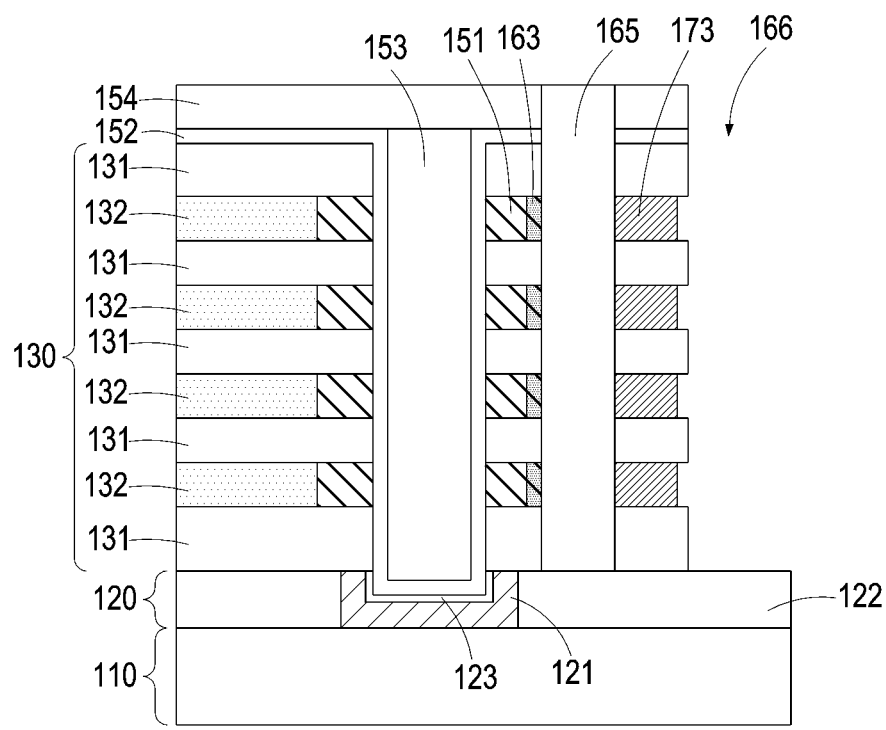
Figure 17C:
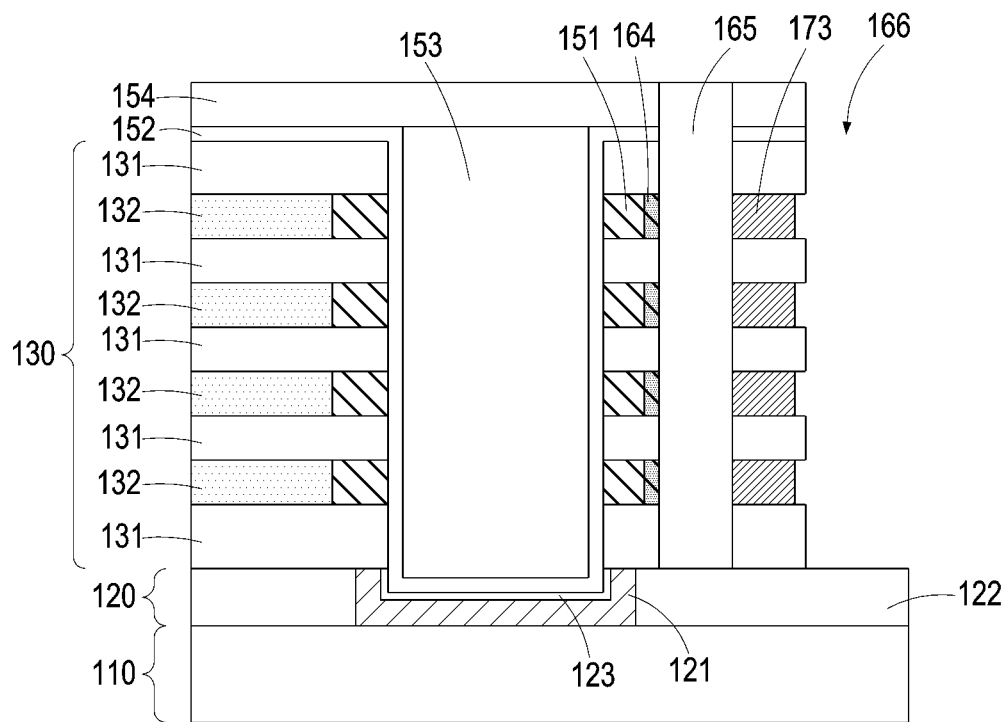
Figure 17D:
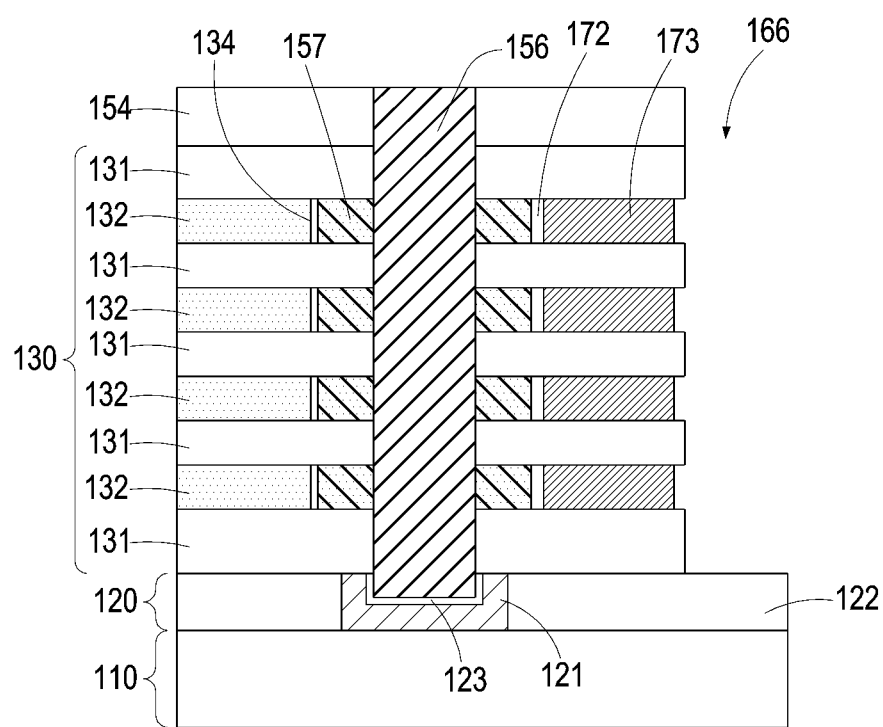

FIG. 17B is a cross-sectional view taken along the line C-C' of FIG. 17A, and FIG. 17C is a cross-sectional view taken along the line D-D' of FIG. 17A. FIG. 17D is a cross-sectional view taken along the line B-B' of FIG. 17A.

Referring to FIGS. 17A to 17D, the gate dielectric layers 172 may be formed. The gate dielectric layers 172 may be formed by selectively oxidizing the surfaces of the channel bodies 157 exposed through the lateral gate recesses 171.

Word lines 173 may be formed over the gate dielectric layers 172 to fill the lateral gate recesses 171. The word lines 173 may be formed of a metal-based material. The word lines 173 may be formed by stacking titanium nitride and tungsten. For example, after conformally forming titanium nitride over the lateral gate recesses 171, the lateral gate recesses 171 may be gap-filled with tungsten. Subsequently, titanium nitride and tungsten may be etched back to form the word lines 173 that are isolated vertically. This may be referred to as a word line isolation process, and the edges of the word lines 173 may be positioned inside the lateral gate recesses 171. That is, the edges of the word lines 173 may be formed with an undercut between the first material layers 131. According to another embodiment of the present invention, the word lines 173 may include polysilicon doped with an impurity.

As described above, a plurality of word lines 173 may be stacked vertically. The first material layers 131 may be positioned between the word lines 173 that are stacked vertically. A plurality of first material layers 131 and a plurality of word lines 173 may be alternately stacked perpendicular to the lower structure 120. The word lines 173 and the active layers 151 may be positioned at the same level.

Figure 18A:
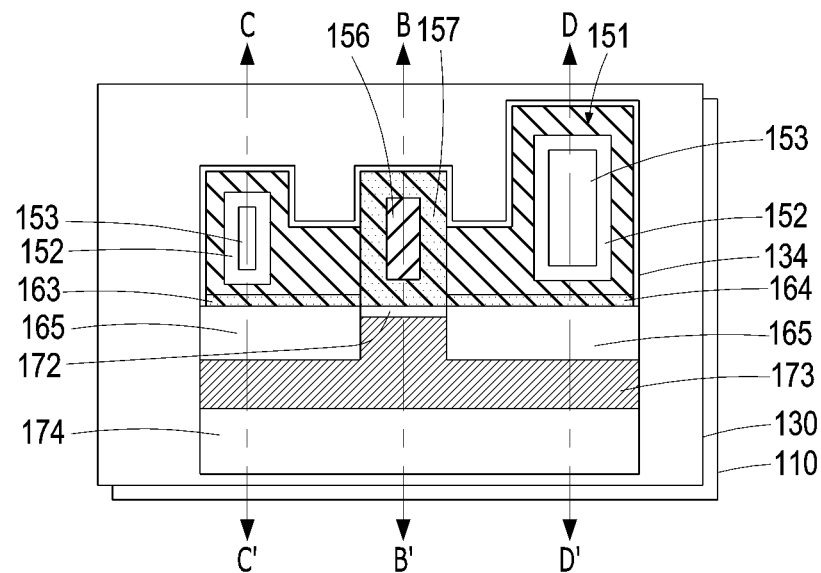
Figure 18B:
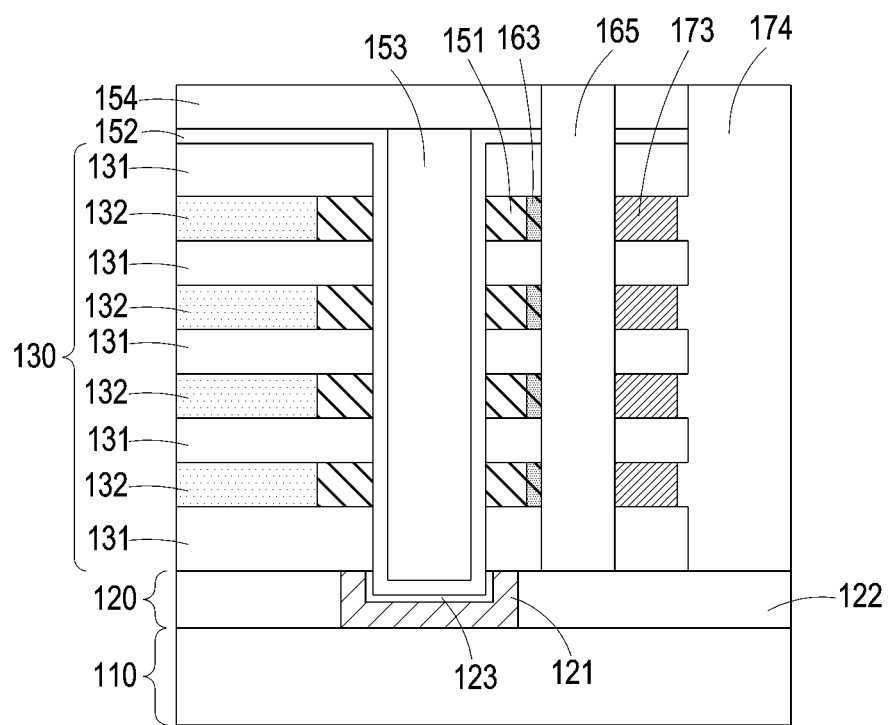
Figure 18C:
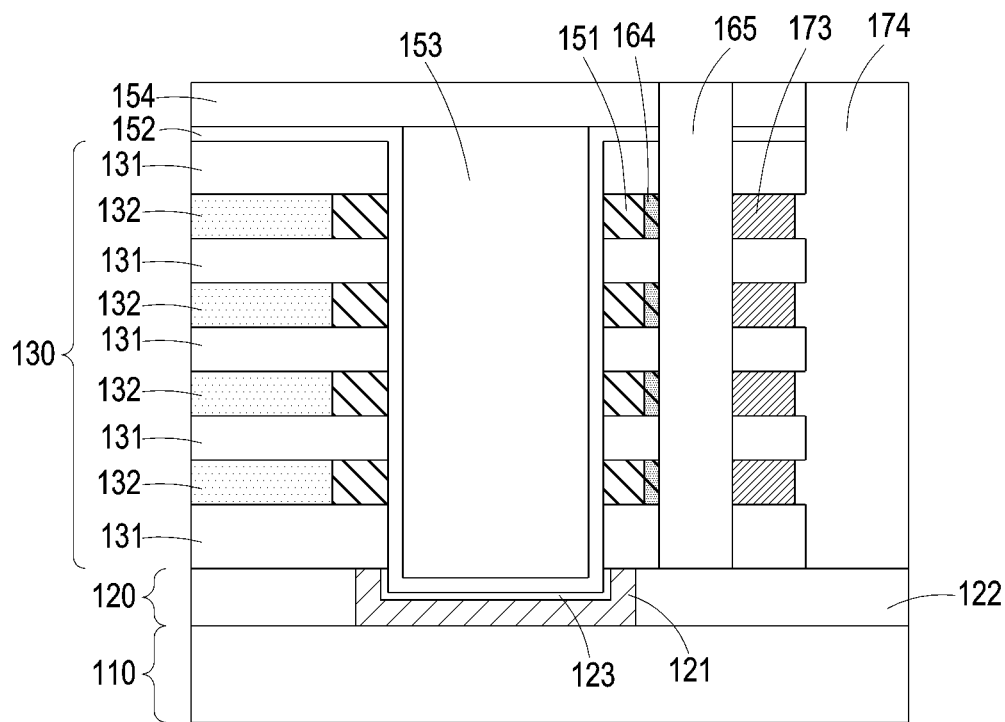
Figure 18D:
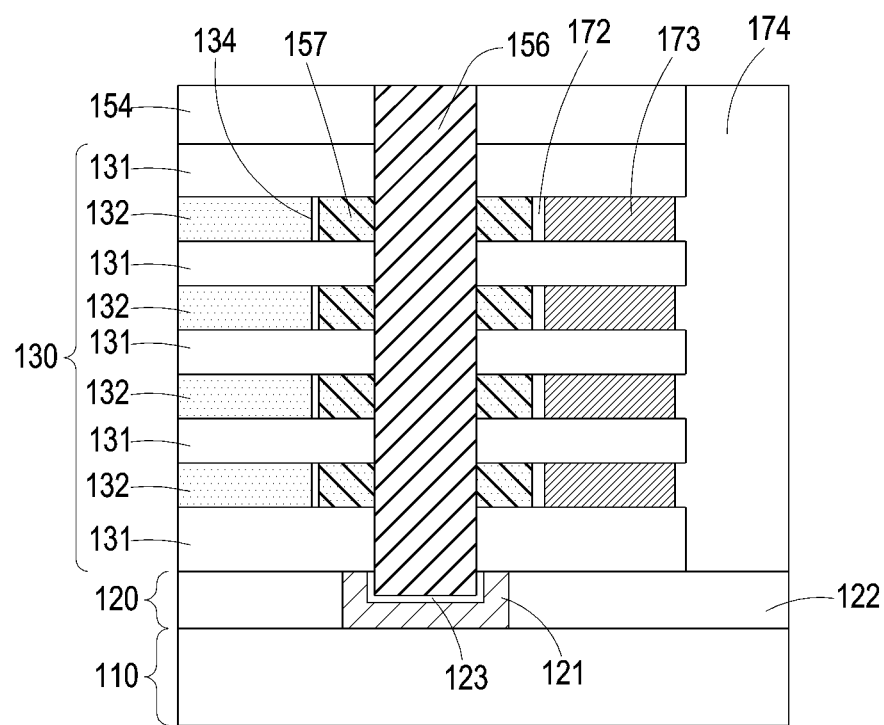

FIG. 18B is a cross-sectional view taken along the line C-C' of FIG. 18A, and FIG. 18C is a cross-sectional view taken along the line D-D' of FIG. 18A. FIG. 18D is a cross-sectional view taken along the line B-B' of FIG. 18A.

Referring to FIGS. 18A to 18D, after forming the word lines 173, the slit 166 may be filled with a slit dielectric layer 174. For example, the slit dielectric layer 174 may include an oxide, e.g. silicon oxide.

Figure 19A:
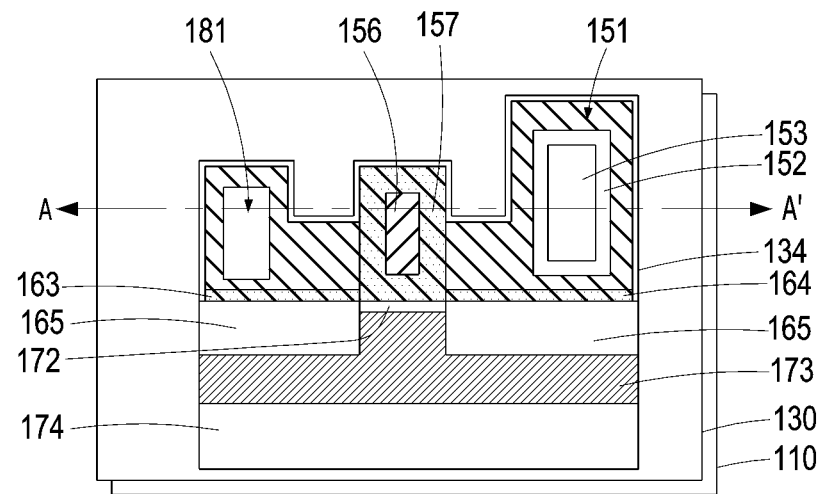
Figure 19B:
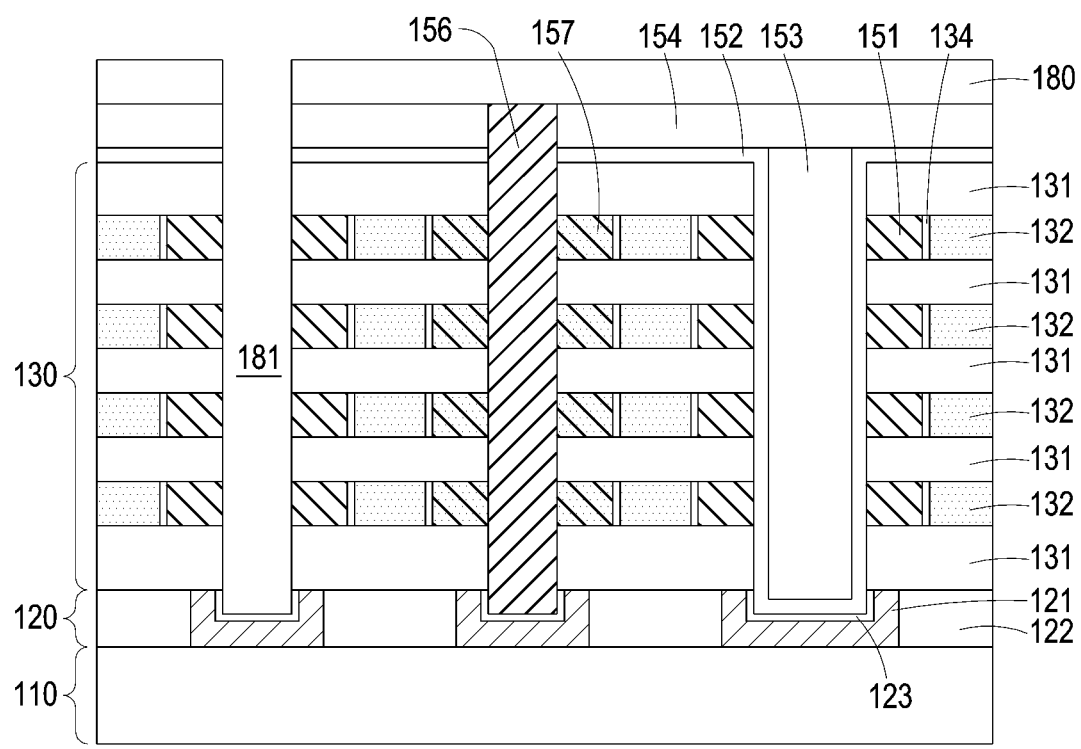

FIG. 19B is a cross-sectional view taken along the line A-A' of FIG. 19A. Referring to FIGS. 19A and 19B, a top inter-layer dielectric layer 180 may be formed over the slit dielectric layer 174 and the upper structure 130. For example, the top inter-layer dielectric layer 180 may include silicon oxide.

Subsequently, the sacrificial material 153 and the sacrificial protective layer 152 filling the second cell opening 142 may be removed to form the bit line opening 181. For example, after etching the top inter-layer dielectric layer 180 of the portion corresponding to the second cell opening 142, the sacrificial material 153 and the sacrificial protective layer 152 filling the second cell opening 142 may be etched.

The protective layer 123 may be exposed on the bottom of the bit line opening 181. The bit line opening 181 may be oriented perpendicular to the lower structure 120. The bit line opening 181 may have a shape that vertically penetrates through the active layers 151.

Figure 20A:
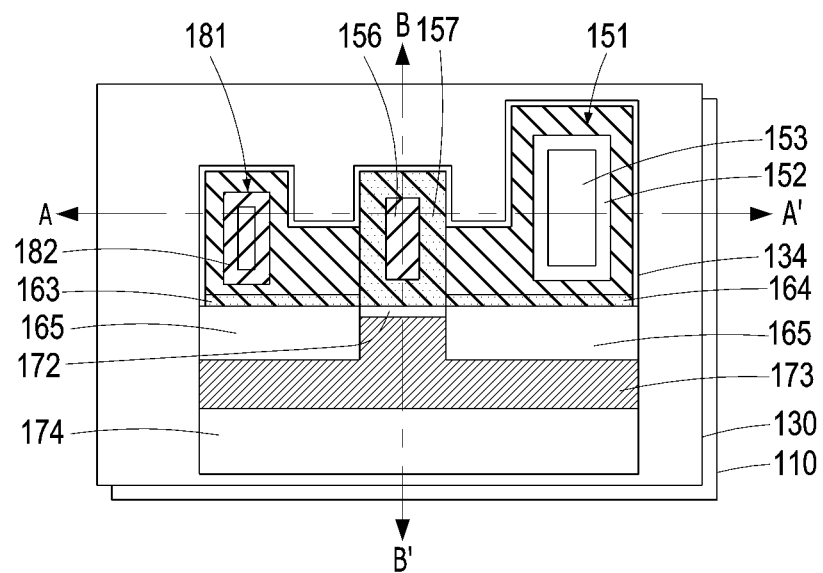
Figure 20B:
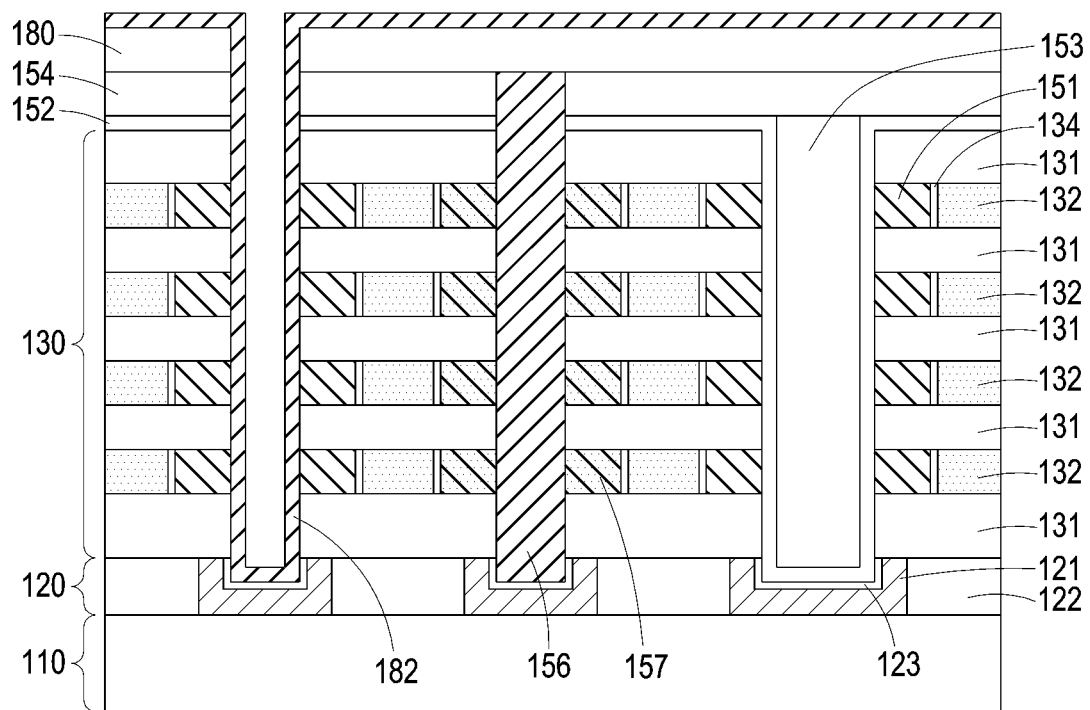

FIG. 20B is a cross-sectional view taken along the line A-A' of FIG. 20A. Referring to FIGS. 20A and 20B, a first contact liner layer 182 covering the bit line opening 181 may be formed. The first contact liner layer 182 may contain an impurity. For example, the first contact liner layer 182 may include N-type polysilicon.

Figure 21A:
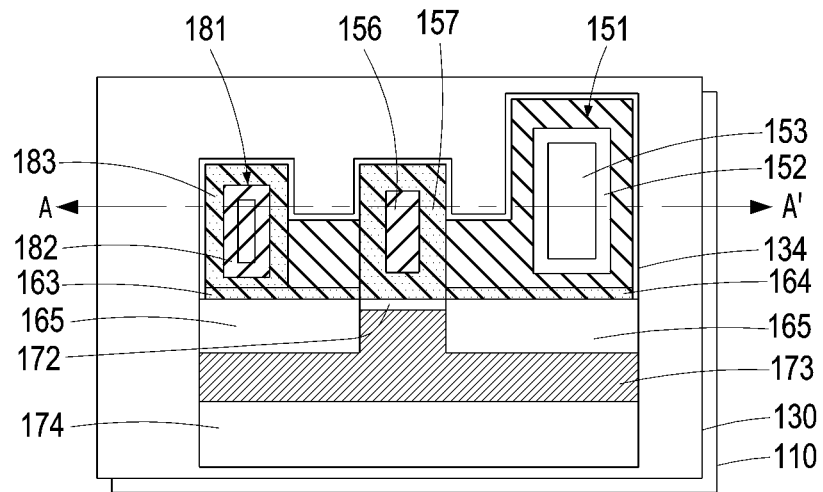
Figure 21B:
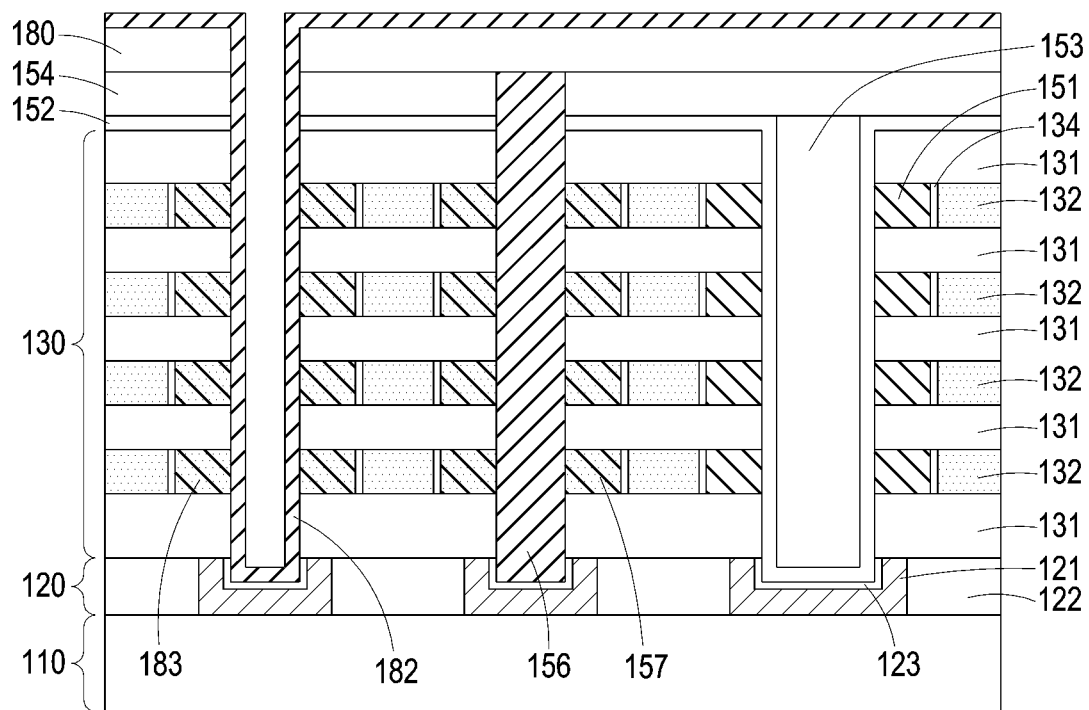

FIG. 21B is a cross-sectional view taken along the line A-A' of FIG. 21A. Referring to FIGS. 21A and 21B, a heat treatment may be performed to diffuse an N-type impurity from the first contact liner layer 182. As a result, a portion of the active layers 151 in contact with the first contact liner layer 182 may be doped with the N-type impurity. The first contact liner layer 182 and the portion of the active layers 151 doped with the N-type impurity may form a bit line contact node 183. From the perspective of a top view, the bit line contact nodes 183 may be shaped to penetrate through the upper structure 130 and may laterally extend to be positioned between the first material layers 131 while covering the sidewall of the bit line opening 181. As such, a portion of the bit line contact nodes 183 may be a portion of the active layer 151 doped with the N-type impurity.

According to another embodiment of the present invention, after the heat treatment, the first contact liner layer 182 may be removed. As such, the bit line contact nodes 183 may not cover the sidewalls of the bit line opening 181 and may only be positioned between the first material layers 131. The bit line contact nodes 183 may be positioned at the same level as the active layers 151 and may be positioned at the same level as the word lines 173 as well.

Figure 22A:
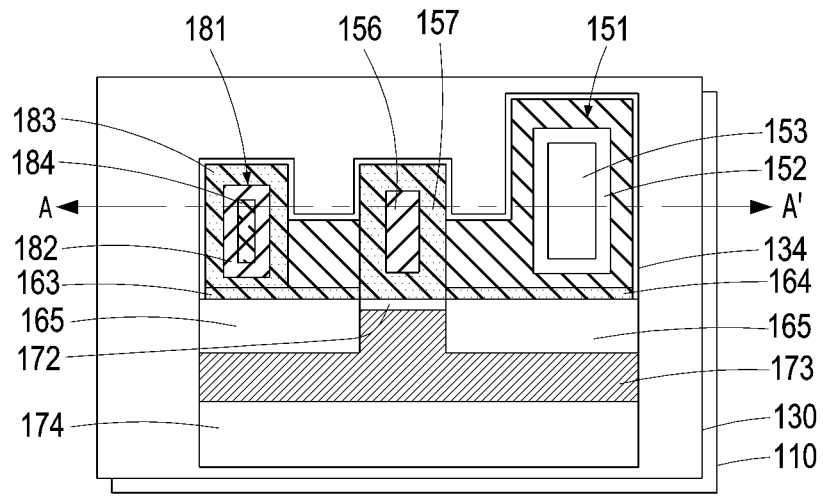
Figure 22B:
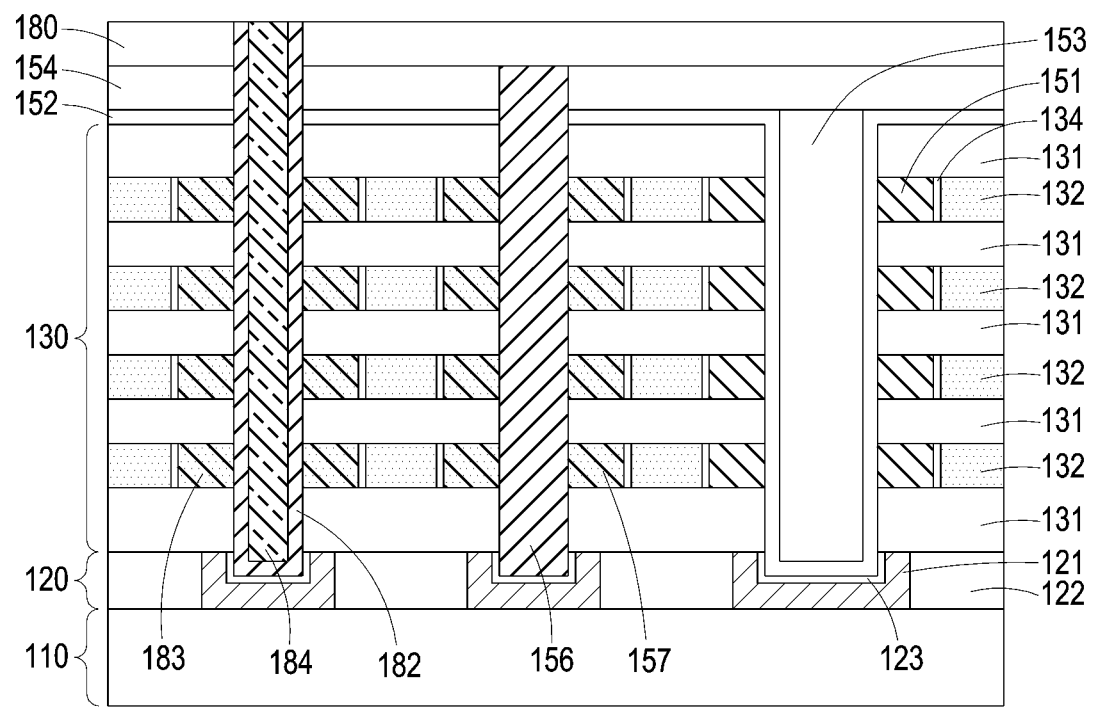

FIG. 22B is a cross-sectional view taken along the line A-A' of FIG. 22A. Referring to FIGS. 22A and 22B, bit lines 184 may be formed over the bit line contact nodes 183 to fill the bit line openings 181. The bit lines 184 may be formed by forming a bit line conductive material to fill the bit line openings 181 and then performing planarization. The bit lines 184 may include a metal-based material. The bit lines 184 may include a stack of a metal nitride and a metal. For example, the bit lines 184 may be formed by stacking titanium nitride and tungsten. According to another embodiment of the present invention, an ohmic contact layer (not shown) may be further formed between the bit lines 184 and the bit line contact nodes 183. For example, the ohmic contact layer may include a metal silicide.

As described above, the bit lines 184 may be oriented perpendicular to the lower structure 120. From the perspective of a top view, the bit lines 184 may have a shape penetrating through the bit line contact nodes 183. The bit line contact nodes 183 may have a shape surrounding the bit lines 184.

Figure 23A:
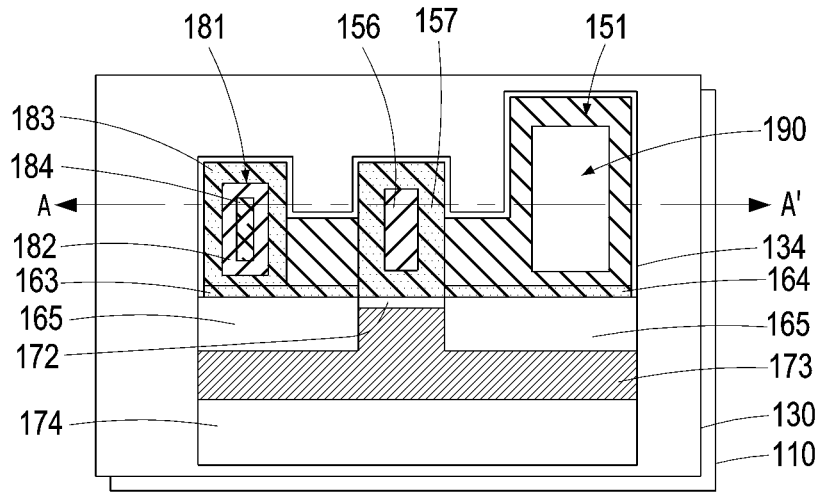
Figure 23B:
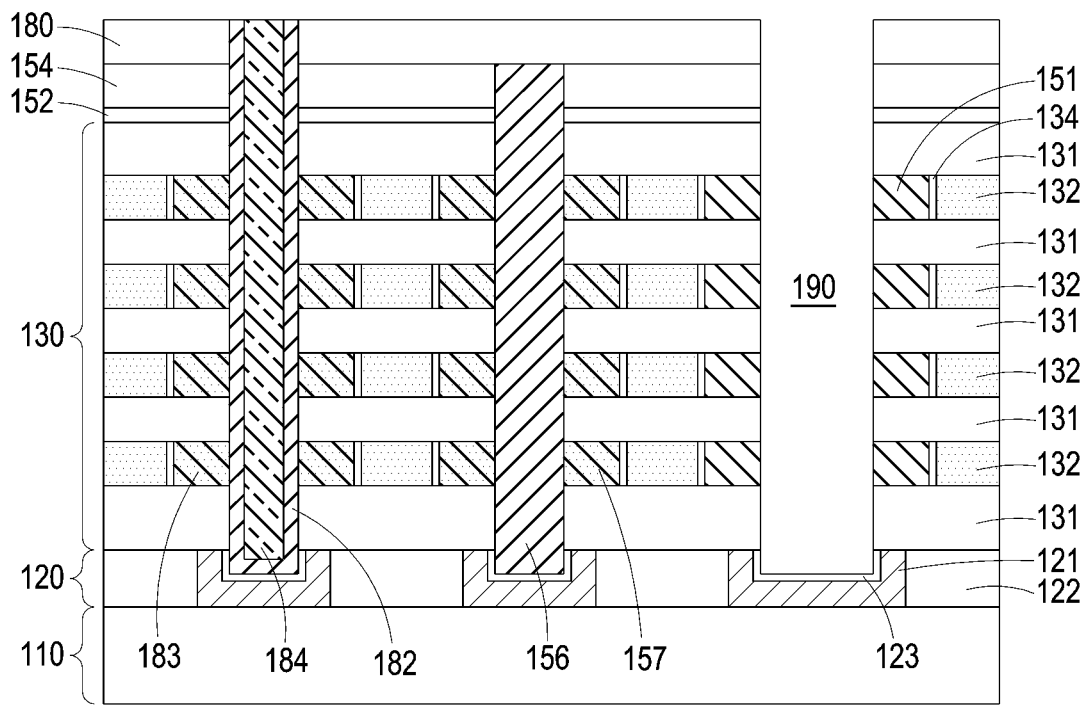

FIG. 23B is a cross-sectional view taken along the line A-A' of FIG. 23A. Referring to FIGS. 23A and 23B, the sacrificial material 153 and the sacrificial protective layer 152 filling the third cell opening 143 may be removed to form the capacitor opening 190. For example, after etching the top inter-layer dielectric layer 180 and the upper inter-layer dielectric layer 154 of a portion corresponding to the third cell opening 143, the sacrificial material 153 and the sacrificial protective layer 152 filling the second cell opening 143 may be etched. Although not shown, an additional hard mask layer may be further formed over the top inter-layer dielectric layer 180, and the sacrificial material 153 and the sacrificial protective layer 152 may be removed by using the additional hard mask layer.

The protective layer 123 may be exposed on the bottom surface of the capacitor opening 190. The capacitor opening 190 may be oriented perpendicular to the lower structure 120. The capacitor opening 190 may be shaped to vertically penetrate through the active layers 151.

Figure 24A:
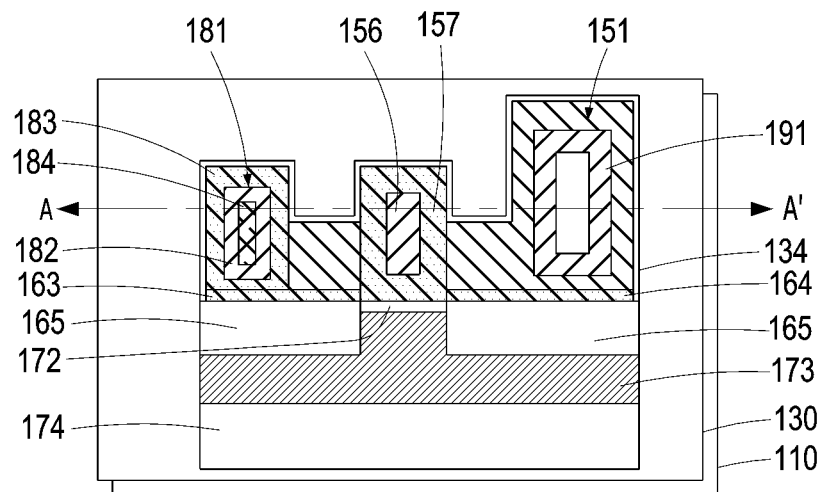
Figure 24B:
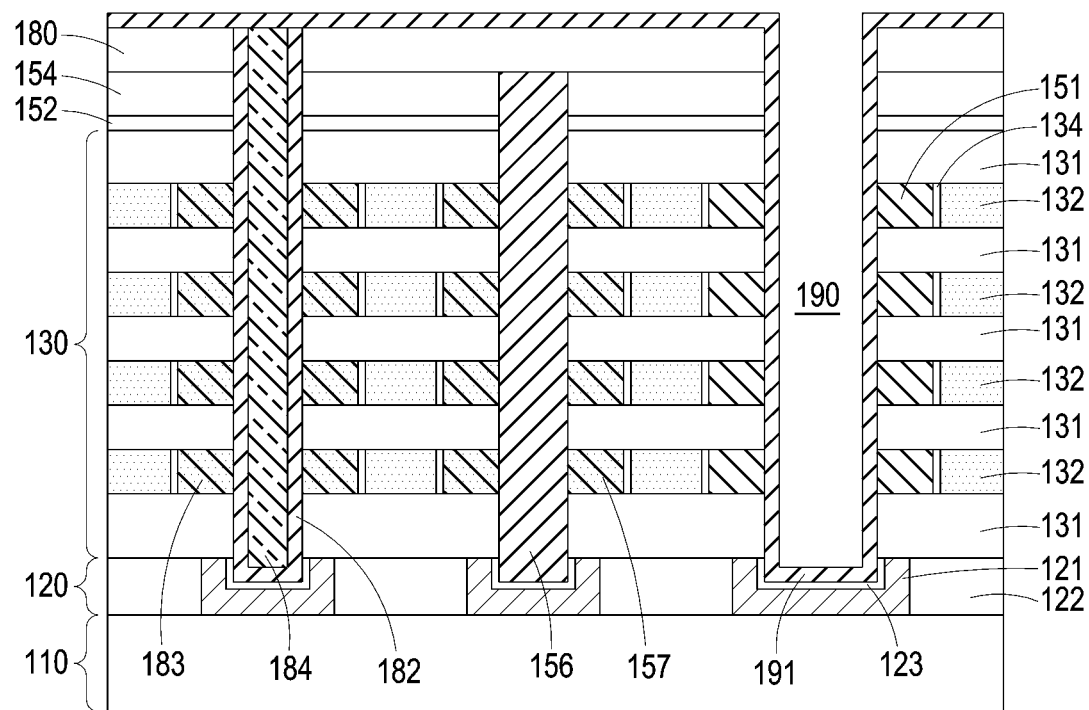

FIG. 24B is a cross-sectional view taken along the line A-A' of FIG. 24A. Referring to FIGS. 24A and 24B, a second contact liner layer 191 may be formed to cover the capacitor opening 190. The second contact liner layer 191 may contain an impurity. For example, the second contact liner layer 191 may include N-type polysilicon.

Figure 25A:
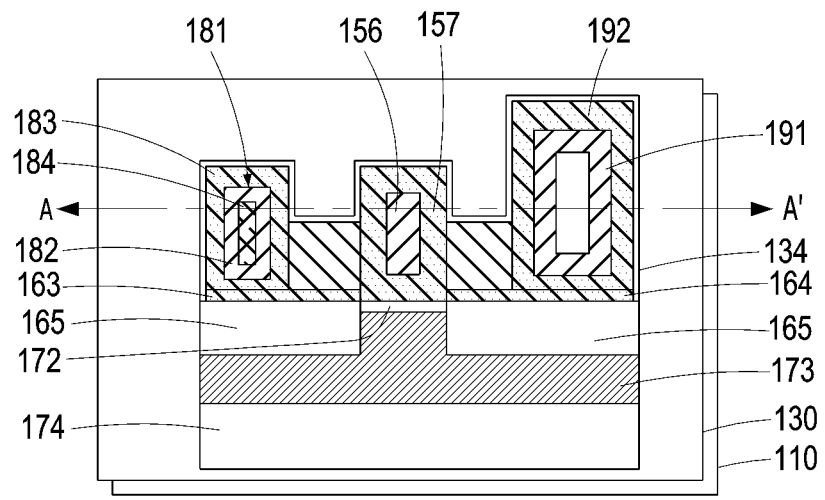
Figure 25B:
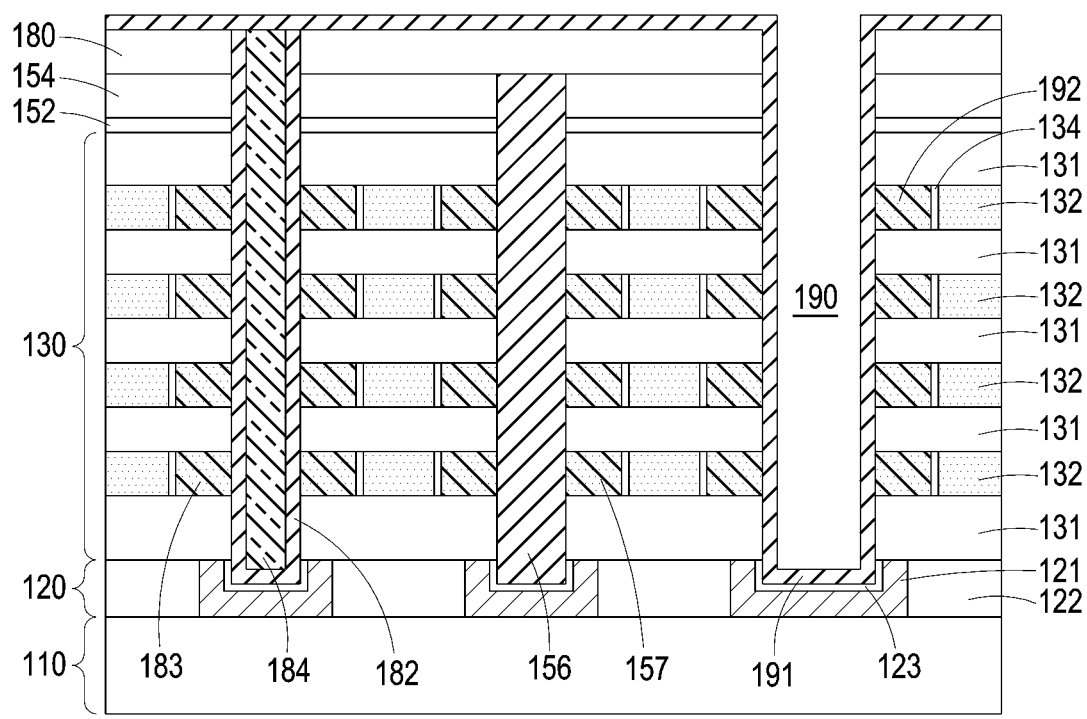

FIG. 25B is a cross-sectional view taken along the line A-A' of FIG. 25A. Referring to FIGS. 25A and 25B, a heat treatment may be performed to diffuse the N-type impurity from the second contact liner layer 191. As a result, a portion of the active layers 151 in contact with the second contact liner layer 191 may be doped with the N-type impurity. A portion of the active layers 151 doped with the N-type impurity may be a storage node 192 of a capacitor. From the perspective of a top view, the storage nodes 192 may extend laterally to be positioned between the first material layers 131 while covering the sidewall of the capacitor opening 190. As such, the storage nodes 192 may be portions in which a portion of the active layers 151 is doped with an N-type impurity. The storage nodes 192 may be stacked vertically with the first material layers 131 interposed therebetween. The storage nodes 192 and the first material layers 131 may be alternately stacked.

Figure 26A:
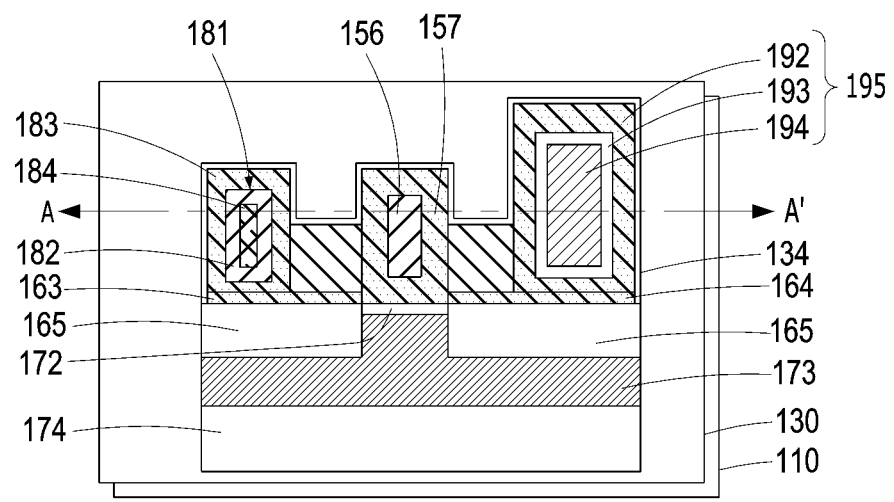
Figure 26B:
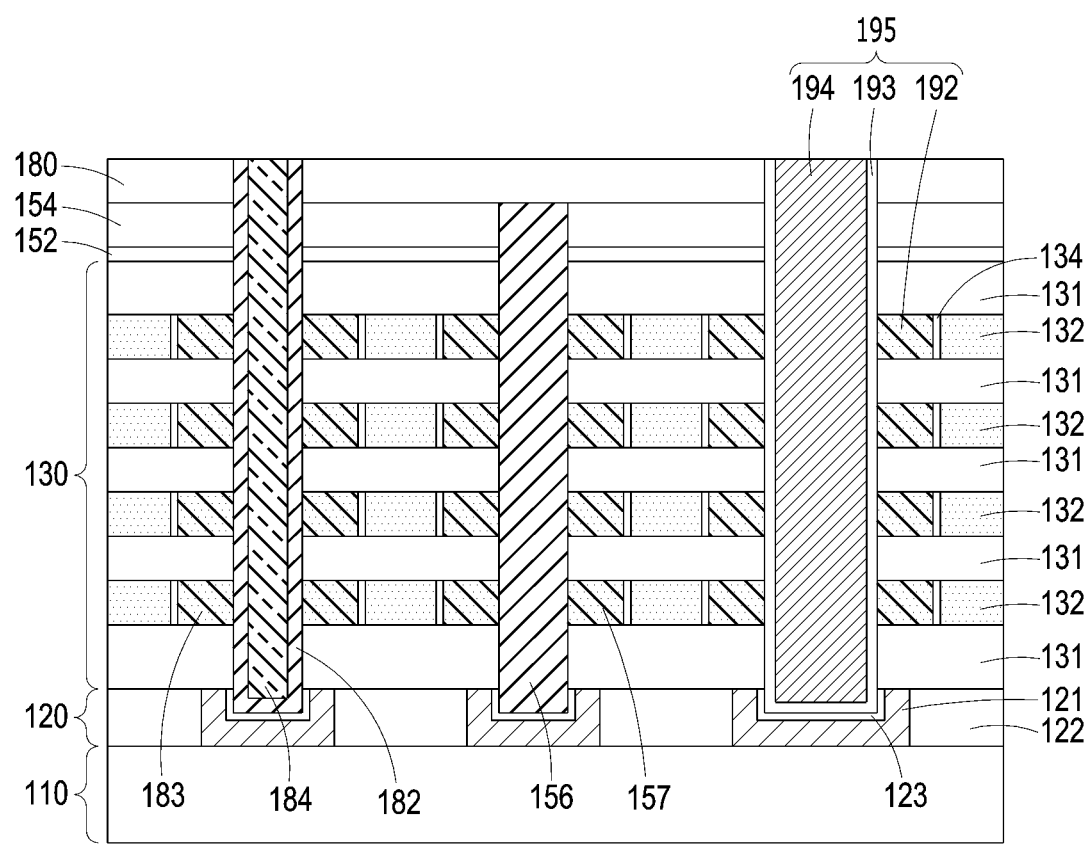

FIG. 26B is a cross-sectional view taken along the line A-A' of FIG. 26A. Referring to FIGS. 26A and 26B, after removing the second contact liner layer 191, a dielectric layer 193 and a plate node 194 may be formed over the storage nodes 192 to fill the capacitor opening 190.

The dielectric layer 193 may conformally cover the capacitor opening 190, and the plate node 194 may fully fill the capacitor opening 190 over the dielectric layer 193.

The dielectric layer 193 and the plate node 194 may be formed by depositing a dielectric material and a plate node layer over the capacitor opening 190 and then planarizing the dielectric material and the plate node layer to remain in the capacitor opening 190.

The dielectric layer 193 may include a single-layered material, a multi-layer material, a laminated material, an intermixing material, or a combination thereof. The dielectric layer 193 may include a high-k material. The dielectric layer 193 may have a higher dielectric constant than silicon oxide ($SiO_2$). The silicon oxide may have a dielectric constant of approximately 3.9, and the dielectric layer 196 may include a material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), or a combination thereof. The dielectric layer 193 may be formed by Atomic Layer Deposition (ALD).

The dielectric layer 193 may be formed of zirconium-based oxide. The dielectric layer 193 may have a stack structure including zirconium oxide ($ZrO_2$). The stack structure including zirconium oxide ($ZrO_2$) may include ZA ($ZrO_2/Al_2O_3$) or ZAZ ($ZrO_2/Al_2O_3/ZrO_2$). ZA may have a structure in which aluminum oxide ($Al_2O_3$) is stacked over zirconium oxide ($ZrO_2$). ZAZ may have a structure in which zirconium oxide ($ZrO_2$), aluminum oxide ($Al_2O_3$), and zirconium oxide ($ZrO_2$) are sequentially stacked. $ZrO_2$, ZA and ZAZ may be referred to as a zirconium oxide-based layer. According to another embodiment of the present invention, the dielectric layer 193 may be formed of hafnium-based oxide. The dielectric layer 193 may have a stack structure including hafnium oxide ($HfO_2$). The stack structure including hafnium oxide ($HfO_2$) may include HA ($HfO_2/Al_2O_3$) or HAH ($HfO_2/Al_2O_3/HfO_2$). HA may have a structure in which aluminum oxide ($Al_2O_3$) is stacked over hafnium oxide ($HfO_2$).

HAH may have a structure in which hafnium oxide ($HfO_2$), aluminum oxide ($Al_2O_3$), and hafnium oxide ($HfO_2$) are sequentially stacked. $HfO_2$, HA and HAH may be referred to as a hafnium oxide-based layer. In ZA, ZAZ, HA, and HAH, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer 193 may include a stack of a high-k material and a high band gap material whose band gap energy is greater than that of the high-k material. The dielectric layer 193 may include silicon oxide ($SiO_2$) as another high band gap material in addition to aluminum oxide ($Al_2O_3$). The dielectric layer 193 may include a high band gap material so that leakage current may be suppressed. The high band gap material may be extremely thin. The high band gap material may be thinner than the high-k materials.

According to another embodiment of the present invention, the dielectric layer 193 may include a laminated structure in which a high-k material and a high band gap material are alternately stacked. For example, ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structure described above, aluminum oxide ($Al_2O_3$) may be extremely thin.

According to another embodiment of the present invention, the dielectric layer 193 may include a hafnium oxide having a tetragonal crystal phase or a zirconium oxide having a tetragonal crystal phase.

According to another embodiment of the present invention, the dielectric layer 193 may have a stack structure including a hafnium oxide having a tetragonal crystal phase and a zirconium oxide having a tetragonal crystal phase.

The plate node 194 may include a metal-based material. The plate node 194 may include a metal nitride. The plate node 194 may include a metal, a metal nitride, a metal carbide, a conductive metal nitride, a conductive metal oxide, or a combination thereof. The plate node 194 may be formed of titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$), or a combination thereof.

As a result of the series of the processes described above, a capacitor 195 may be formed, and the capacitor 195 may include a storage node 192, a dielectric layer 193, and a plate node 194. The dielectric layer 193 and the plate node 194 may be oriented perpendicular to the lower structure 120, and each storage node 192 may surround the dielectric layer 193 and the plate node 194. The storage nodes 192 may have a lateral annular shape.

Figure 27A:
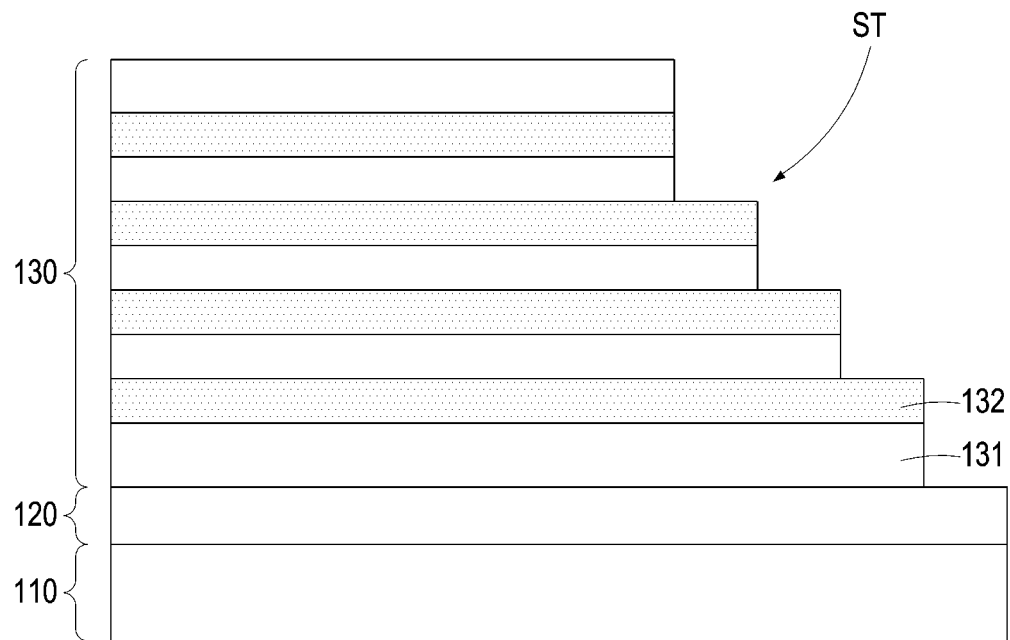
FIGS. 27A and 27B illustrate a stepped word line structure.
Figure 27B:
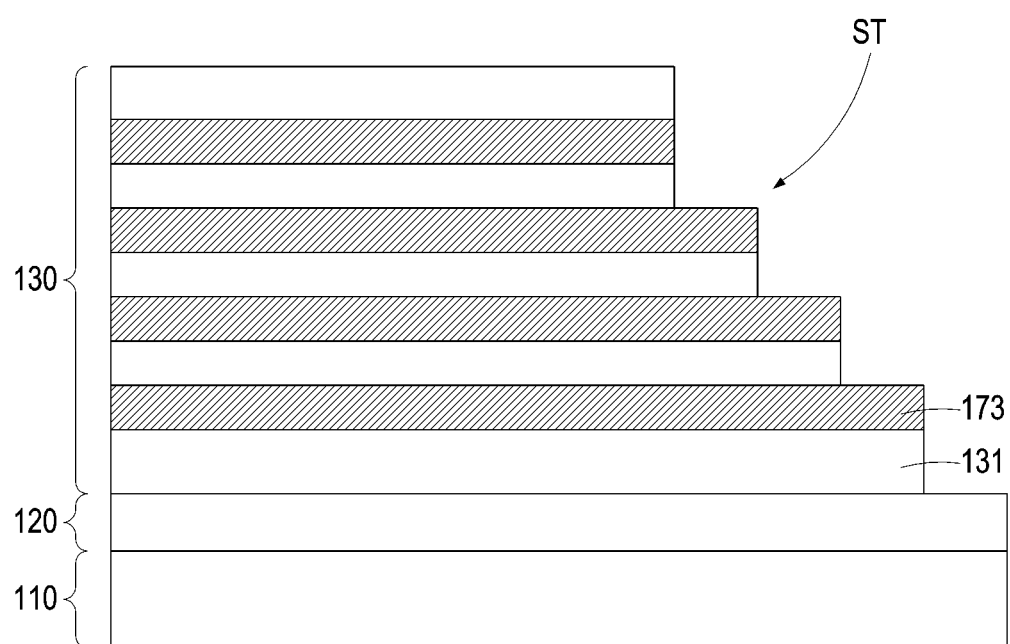

FIGS. 27A and 27B illustrate a method for forming a stepped word line structure. The stepped world line structure may be stepped on both opposite ends of the word lines.

Referring to FIG. 27A, a stepped structure ST may be formed by selectively etching the first material layers 131 and the second material layers 132 of the upper structure 130. The process for forming the stepped structure ST may be called a slimming process. The stepped structure ST may be formed at the same time as the isolated opening 161 shown in FIGS. 13A to 13C.

Referring to FIGS. 16A to 16D, the second material layers 132 may be selectively removed to form gate recesses 171 between the first material layers 131.

Subsequently, as shown in FIG. 27B, the gate recesses 171 may be filled with the word lines 173.

As described above, when the stepped structure ST is formed in the upper structure 130, at least one end of the word line 173 may be formed in the stepped structure ST.

Figure 28:
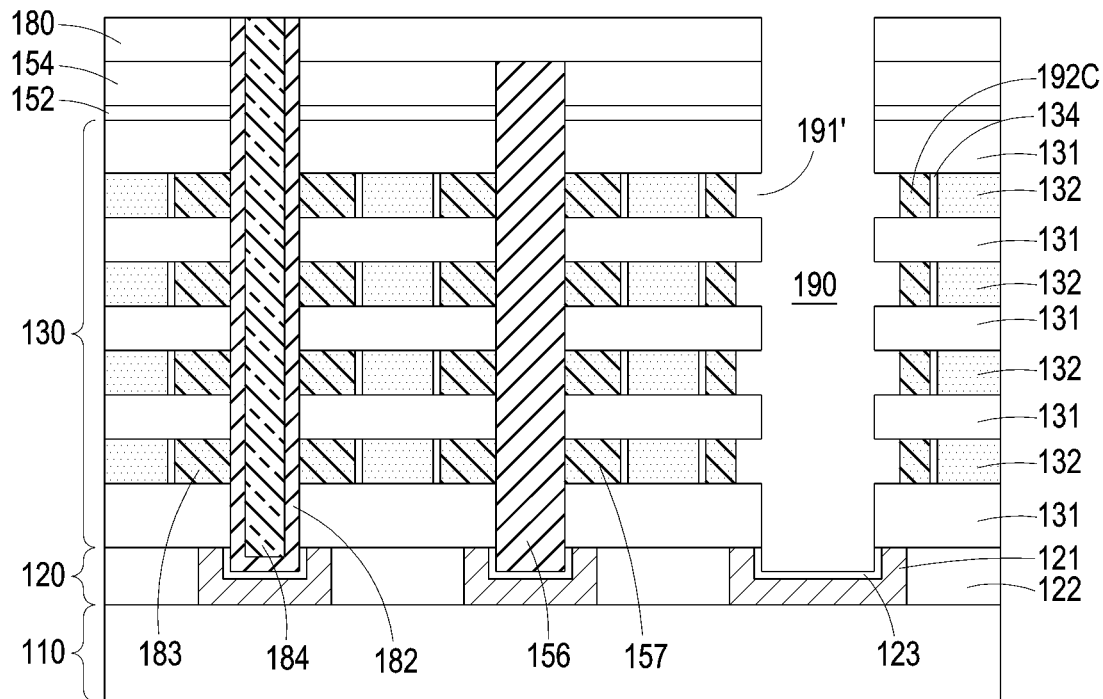
FIGS. 28 to 30 illustrate a method for fabricating a memory device in accordance with another embodiment of the present invention.
Figure 29:
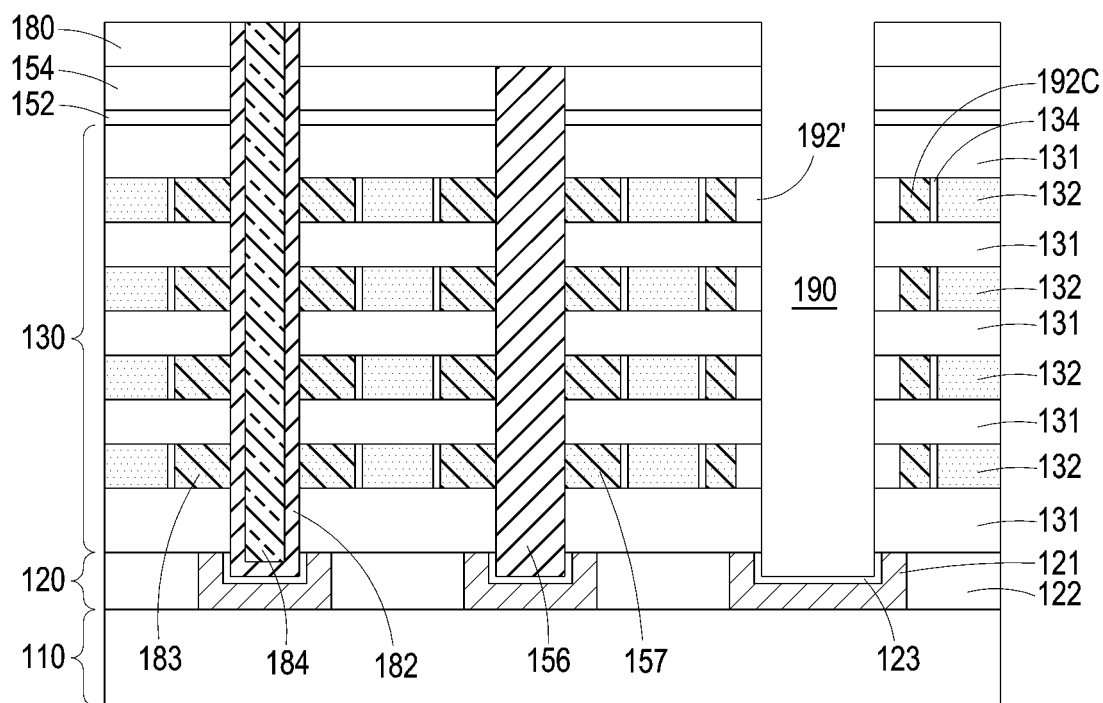
Figure 30:
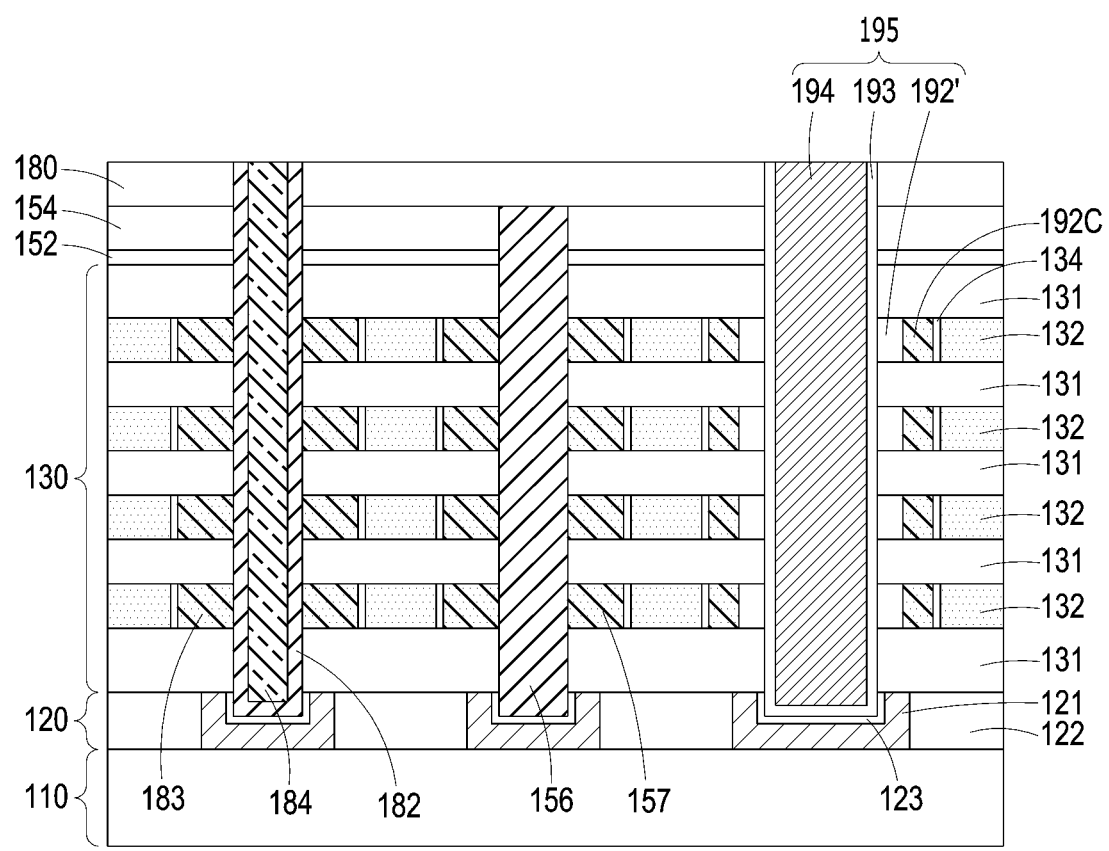

FIGS. 28 to 30 illustrate a method for fabricating a memory device in accordance with another embodiment of the present invention. A method of forming the other constituent elements except the capacitor will be referred to the method illustrated in FIGS. 3A to 22B.

First, referring to FIGS. 23A and 23B, a capacitor opening 190 may be formed.

Subsequently, as shown in FIG. 28, the sides of the active layers 151 exposed by the capacitor opening 190 may be selectively removed to form storage node recesses 191'. The storage node recesses 191' may be positioned between the first material layers 131.

Subsequently, a capacitor contact node 192C may be formed in the active layers 151 remaining due to the storage node recesses 191'.

For example, referring to FIGS. 24A to 25B, a second contact liner layer 191 may be formed to cover the capacitor opening 190. The second contact liner layer 191 may contain an impurity. The second contact liner layer 191 may include N-type polysilicon. Subsequently, an N-type impurity may be diffused from the second contact liner layer 191 by performing a heat treatment. As a result, some of the active layers 151 in contact with the second contact liner layer 191 may be doped with the N-type impurity. A portion of the active layers 151 doped with the N-type impurity may be a capacitor contact node 192C. From the perspective of a top view, the capacitor contact nodes 192C may extend laterally to be positioned between the first material layers 131 while covering the sidewall of the capacitor opening 190. As such, the capacitor contact nodes 192C may be portions in which portions of the active layers 151 are doped with the N-type impurity. The capacitor contact nodes 192C may partially fill the storage nodes 191', respectively. According to another embodiment of the present invention, a metal silicide may be further formed over the capacitor contact nodes 192C. To form the metal silicide, a deposition process of titanium/titanium nitride and an annealing process may be performed, and unreacted titanium/titanium nitride may be removed.

Referring to FIG. 29, storage nodes 192' may be formed in the storage node recesses 191'. After a conductive material is deposited to fill the storage node recesses 191', the conductive material may be selectively etched. For example, the storage nodes 192' may be formed to be isolated from each other while filling the storage node recesses 191' by etching back the conductive material. The storage nodes 192' may include a metal, a metal nitride, a metal carbide, a conductive metal nitride, a conductive metal oxide, or a combination thereof. The storage nodes 192' may include titanium (Ti), titanium nitride (TiN), tantalum nitride (TaN), tungsten (W), tungsten nitride (WN), ruthenium (Ru), iridium (Ir), and ruthenium oxide ($RuO_2$), iridium oxide ($IrO_2$), or a combination thereof. The storage nodes 192' may have a lateral annular shape.

Referring to FIG. 30, a dielectric layer 193 and a plate node 194 may be formed over the storage nodes 192' to fill the capacitor opening 190. The dielectric layer 193 and the plate node 194 will be described with reference to FIGS. 26A and 26B. The dielectric layer 193 may conformally cover the capacitor opening 190, and the plate node 194 may fully fill the capacitor opening 190 over the dielectric layer 193. The dielectric layer 193 and the plate node 194 may be formed by stacking a dielectric material and a plate node layer over the capacitor opening 190 and then performing a planarization on the dielectric material and the plate node layer so that the dielectric material and the plate node layer may remain in the capacitor opening 190. The storage nodes 192' may surround the dielectric layer 193 and the plate node 194. The capacitor contact nodes 192C may surround the storage nodes 192'.

Figure 31:
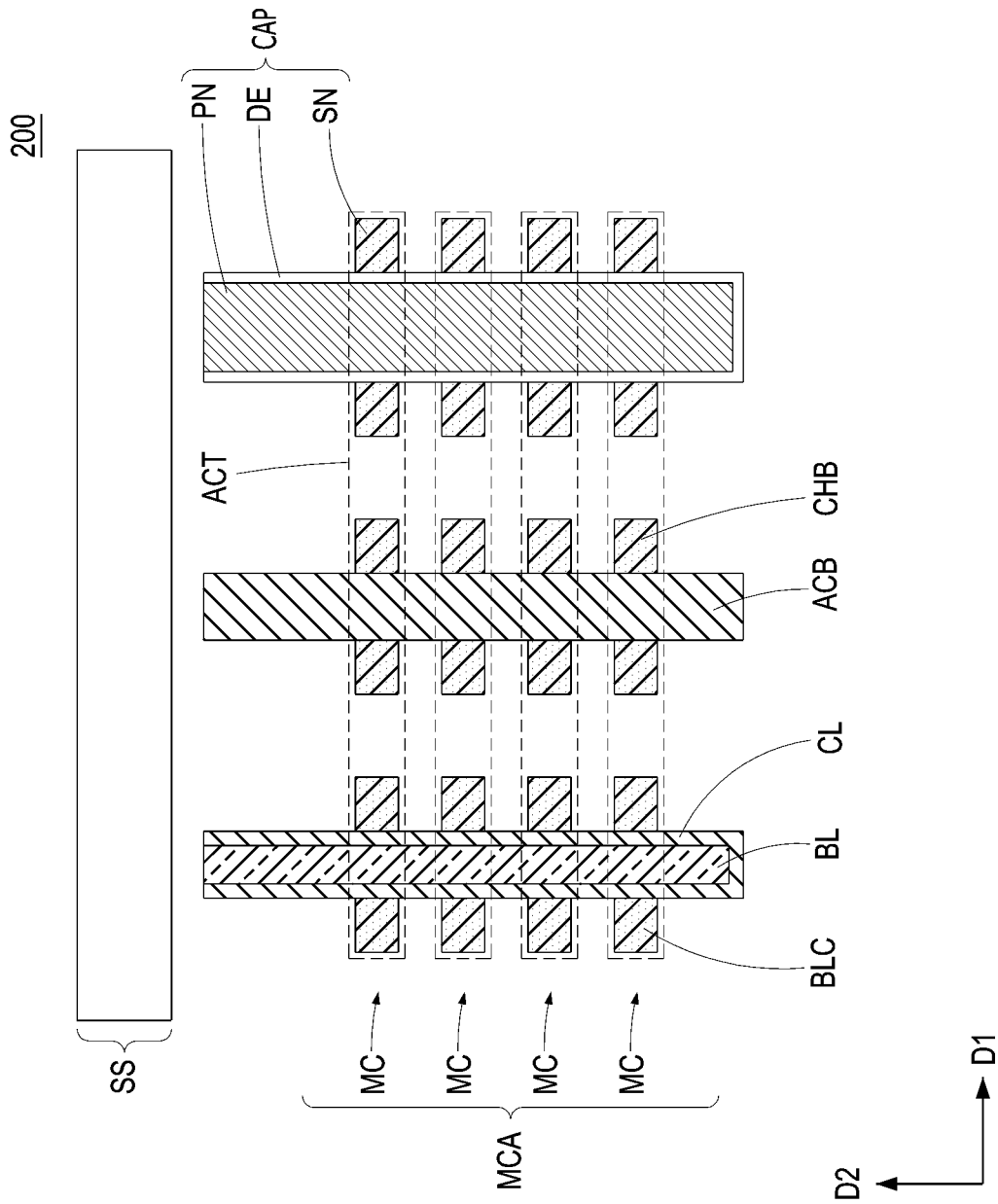
FIGS. 31 to 33 illustrate memory devices in accordance with other embodiments of the present invention.

FIG. 31 is a cross-sectional view illustrating a memory device in accordance with another embodiment of the present invention. The memory device 200 of FIG. 31 may be similar to the memory device 100M of FIG. 1A.

Referring to FIG. 31, the memory device 200 may include a substrate SS, an active layer ACT that is spaced apart from the substrate SS and laterally oriented in the first direction D1, a word line WL that is laterally oriented in parallel to the active layer ACT along one side of the active layer ACT, an active body ACB that is vertically oriented in the second direction D2 by penetrating through the active layer ACT, a bit line BL that is vertically oriented in the second direction D2 by penetrating through the active layer ACT to be spaced apart from one side of the active body ACB, and a capacitor CAP that is vertically oriented in the second direction D2 by penetrating through the active layer ACT to be spaced apart from the other side of the active body ACB.

In the memory device 200 of FIG. 31, the memory cell array MCA may be positioned below the substrate SS. The substrate SS may include a substrate structure including a peripheral circuit, and the peripheral circuit may include at least one control circuit for controlling the memory cell array MCA. The bit line BL, the active body ACB, and the capacitor CAP may extend downwardly vertically from the substrate SS. The active layer ACT and the word line WL may be positioned at the same level and may be parallel to the plane of the substrate SS.

Figure 32:
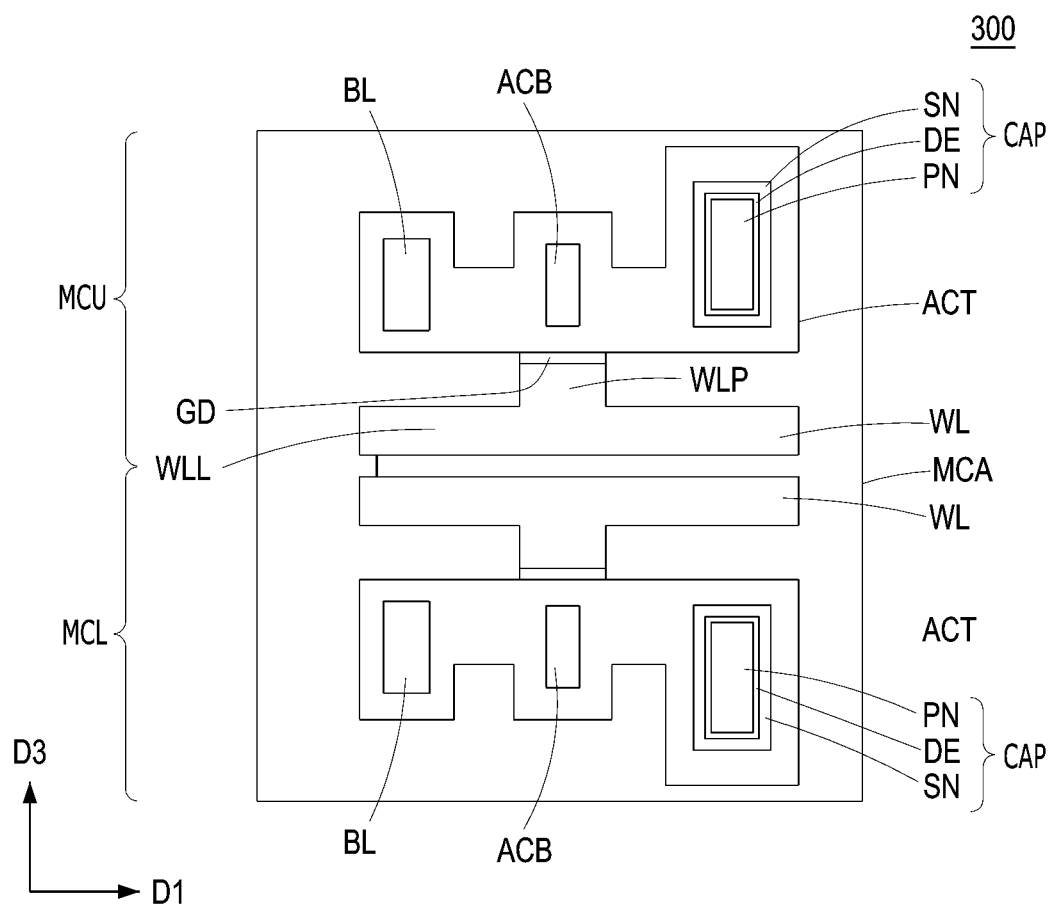

FIG. 32 illustrates a memory device in accordance with another embodiment of the present invention. The memory device 300 of FIG. 32 may be similar to the memory device 100M of FIG. 1A.

Referring to FIG. 32, neighboring memory cells MCU and MCL may be symmetrical with each other in the third direction D3 with the word lines WL therebetween.

Figure 33:
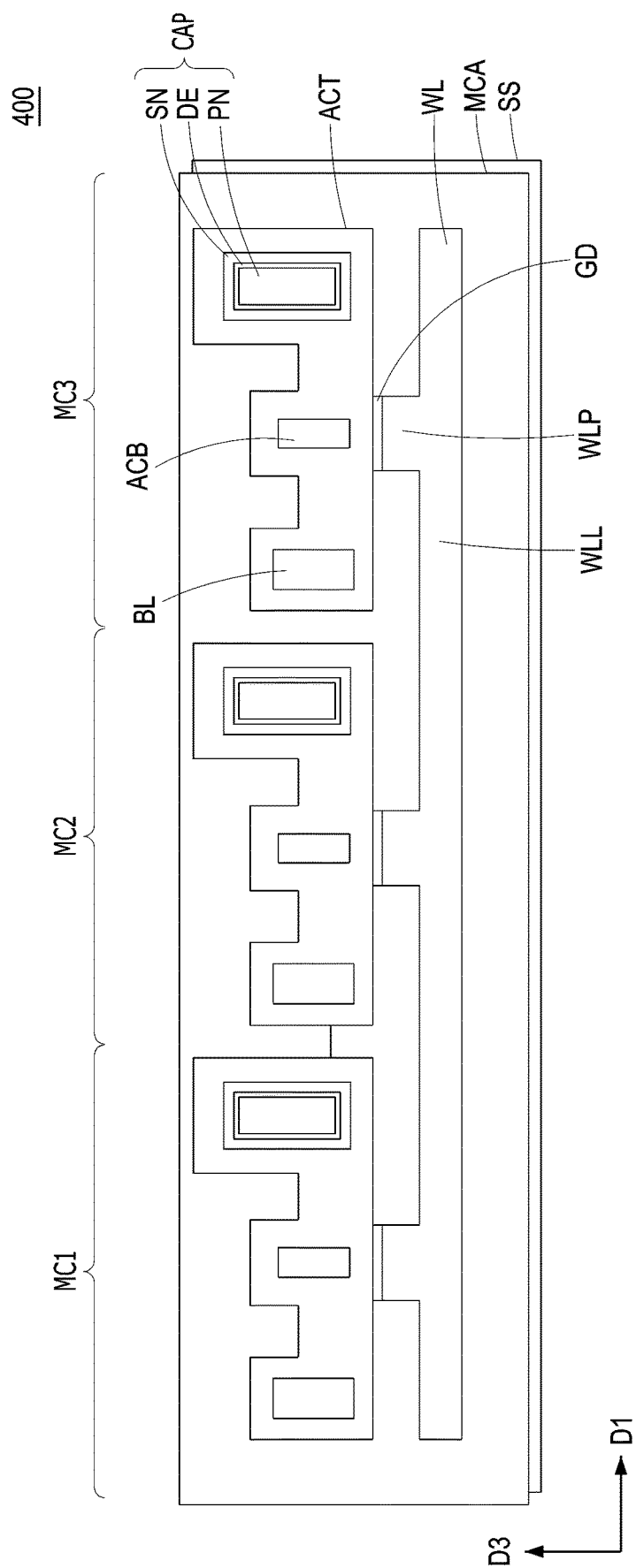

FIG. 33 illustrates a memory device in accordance with another embodiment of the present invention. The memory device 400 of FIG. 33 may be similar to the memory device 100M of FIG. 1A.

Referring to FIG. 33, neighboring memory cells MC1, MC2 and MC3 may share one word line WL. The word line WL may extend along the first direction D1.

According to the embodiments of the present invention, it is possible to increase cell density and decrease parasitic capacitance by vertically stacking memory cells in a three-dimensional structure.

According to the embodiments of the present invention, it is also possible to realize a highly integrated memory device in a limited area by stacking memory cells vertically with respect to a peripheral circuit portion.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a memory device, comprising:
    forming a plurality of active layers arranged vertically with respect to a substrate;
    forming a vertically oriented active body that penetrates through the active layers to interconnect the active layers to each other;
    forming a vertically oriented bit line that is spaced apart from one side of the active body and penetrates through the active layers;
    forming a vertically oriented capacitor that is spaced apart from another side of the active body and penetrates through the active layers; and
    forming a plurality of word lines that are laterally oriented adjacent to one side of each of the active layers.

2. The method of claim 1, wherein the forming of the plurality of active layers arranged vertically with respect to the substrate includes:
    forming an alternating stack in which dielectric materials and sacrificial materials are alternately stacked;
    forming a vertically oriented cell opening that penetrates through the alternating stack;
    forming recesses that extend laterally from the cell opening by selectively recessing the sacrificial materials through the cell opening; and
    forming the active layers respectively filling the recesses.

3. The method of claim 1, wherein each of the active layers includes a plurality of fingers.

4. The method of claim 1, wherein the forming of the vertically oriented active body that penetrates through the active layers to interconnect the active layers to each other includes:
    forming an alternating stack in which dielectric materials and sacrificial materials are alternately stacked;
    replacing a portion of the sacrificial materials with the channel body; and
    forming the vertically oriented active body that penetrates through the channel body.

5. The method of claim 4, wherein the forming of the vertically oriented active body that penetrates through the active layers to interconnect the active layers to each other includes:
    forming an alternating stack in which dielectric materials and sacrificial materials are alternately stacked;
    forming a first cell opening that is vertically oriented by penetrating through the alternating stack;
    forming recesses that extend laterally from the first cell opening by selectively recessing the sacrificial materials through the first cell opening;
    filling the first cell opening from which the sacrificial materials are removed with a silicon material;
    forming the active body doped with an impurity while filling the first cell opening over the silicon material and; and
    diffusing the impurity from the active body to form the channel body.

6. The method of claim 1, wherein the forming of the vertically oriented bit line that is spaced apart from one side of the active body and penetrates through the active layers includes:
    forming an alternating stack in which dielectric materials and sacrificial materials are alternately stacked over the substrate;
    replacing a portion of the sacrificial materials with bit line contact nodes; and
    forming a conductive material that penetrates through the bit line contact nodes to form the vertically oriented bit line.

7. The method of claim 6, wherein the forming of the vertically oriented bit line that is spaced apart from one side of the active body and penetrates through the active layers includes:
    forming an alternating stack in which dielectric materials and sacrificial materials are alternately stacked over the substrate;
    forming a second cell opening vertically oriented by penetrating through the alternating stack;
    forming recesses that extend laterally from the cell opening by selectively recessing the sacrificial materials through the second cell opening;
    filling the second cell opening from which the sacrificial materials are removed with the bit line contact nodes; and
    forming the vertically oriented bit line filling the second cell opening over the bit line contact nodes.

8. The method of claim 1, wherein the forming of the vertically oriented capacitor that is spaced apart from another side of the active body and penetrates through the active layers includes:
    forming an alternating stack in which dielectric materials and sacrificial materials are alternately stacked over the substrate;
    replacing a portion of the sacrificial materials with storage nodes; and
    forming a dielectric layer and a plate node that are vertically oriented to penetrate through the storage nodes.

9. The method of claim 8, wherein the forming of the vertically oriented capacitor that is spaced apart from another side of the active body and penetrates through the active layers includes:
    forming an alternating stack in which dielectric materials and sacrificial materials are alternately stacked over the substrate;
    forming a third cell opening that is vertically oriented by penetrating through the alternating stack;
    forming recesses extending laterally from the third cell opening by selectively recessing the sacrificial materials through the third cell opening;
    filling the third cell opening from which the sacrificial materials are removed with capacitor contact nodes; and
    forming storage nodes surrounded by the capacitor contact nodes over the capacitor contact nodes; and
    forming the dielectric layer and the plate node filling the third cell opening over the storage nodes.

10. The method of claim 1, wherein in the forming of the plurality of the active layers arranged vertically with respect to the substrate,
    each of the active layers includes a first cell opening, a second cell opening, and a third cell opening, and the first cell opening, the second cell opening, and the third cell opening are vertically oriented with respect to each other.

11. The method of claim 10, wherein the first cell opening is filled with the vertically oriented active body, and the second cell opening is filled with the vertically oriented bit line, and the third cell opening is filled with the vertically oriented capacitor.

12. The method of claim 1, further comprising:

forming a first source/drain region in each of the active layers;

forming a second source/drain region laterally spaced apart from the first source/drain region in each of the active layers; and forming a channel body laterally oriented between the first source/drain region and the second source/drain region.

13. The method of claim 12, wherein the forming of the first source/drain region and the forming of the second source/drain region includes:

forming an opening that exposes one side of each of the active layers; and doping an impurity on one side of each of the active layers through the opening.

14. The method of claim 12, wherein the forming of the channel body laterally oriented between the first source/drain region and the second source/drain region includes:

forming an opening vertically oriented by penetrating through each of the active layers;

forming the impurity-doped active body that fills the opening; and diffusing the impurity from the impurity-doped active body to form the channel body.

15. The method of claim 1, wherein the forming of the plurality of the word lines that are laterally oriented adjacent to one side of each of the active layers includes:

forming an opening vertically oriented in parallel to one side of the active layer;

forming gate recesses that extend laterally from the opening; and filling the gate recesses with a conductive material to form the word lines.

* * * * *